United States Patent
Hemmati

(10) Patent No.: US 6,680,986 B1
(45) Date of Patent: Jan. 20, 2004

(54) METHOD FOR IMPLEMENTING SHARED CHANNEL DECODER FOR ONBOARD PROCESSING SATELLITES

(75) Inventor: Farhad Hemmati, Rockville, MD (US)

(73) Assignee: Intelsat Global Service Corporation, Washington, DC (US)

( * ) Notice: Subject to any disclaimer, the term of this patent is extended or adjusted under 35 U.S.C. 154(b) by 0 days.

(21) Appl. No.: 09/444,315

(22) Filed: Nov. 22, 1999

(51) Int. Cl.[7] .................. H04L 27/06; H04L 23/02; H03M 13/03
(52) U.S. Cl. .................. 375/341; 375/265; 714/795
(58) Field of Search .................. 375/341, 262, 375/265, 340; 714/792, 795, 796

(56) References Cited

U.S. PATENT DOCUMENTS 5,970,104 A  * 10/1999  Zhong et al. ............... 375/341
6,415,415 B1 *  7/2002  Karabed ..................... 714/795
6,452,984 B1 *  9/2002  Banister et al. ............. 375/341

OTHER PUBLICATIONS

Oliver M. Collins, Member; The Subtleties and Intricacies of Building a Constraint Length 15 Convolutional Decoder; IEEE Transactions on Communications, vol. 40; No. 12; Dec. 1992; pp. 1810–1819.

* cited by examiner

Primary Examiner—Khai Tran
(74) Attorney, Agent, or Firm—Sughrue Mion, PLLC

(57) ABSTRACT

A decoding method and apparatus, using the Viterbi algorithm for selecting survivor paths terminating on each trellis state, applied for realization of a shared channel decoder (SCD). The shared channel decoder include a branch metric calculator for calculating branch metrics $B_t$, a plurality of ACS units for computing and exchanging new path metrics $\Gamma_t$ and survivor paths $E_t$, a memory (RAM) for storing new path metrics $\Gamma_t$ and survivor paths $E_t$, and a memory (RAM) for storing previous path metrics $\Gamma_{t-1}$ and previous survivor paths $E_{t-1}$. The branch metrics $B_t$ is the set of branch metrics for decoding step t (e.g., for a code rate of ½, $B_t=\{B_{t,00}, B_{t,01}, B_{t,10}, B_{t,11}\}$), the path metrics $\Gamma_t$ is the set of S survivor metrics $\{\gamma_{t,1}, \gamma_{t,2}, \ldots, \gamma_S\}$ at decoding step t and the survivor paths $E_t$ is the set of S survivor metrics $\{E_{t,1}, E_{t,2}, \ldots, E_{t,S}\}$ where S is the number of decoder states. In one embodiment, the shared channel decoder includes a branch metric queue for storing branch metrics $B_t$, a tentative path metric memory for storing tentative path metrics $\Gamma_{(c+1)D}$, and a multiplexer (selector) for selecting the previous path metrics $\Gamma_{t-1}$ when $t \neq T+cD$, and selecting the tentative path metrics $\Gamma_{(c+1)D}$ when $t=T+cD$. In an alternative embodiment, the size of required RAM is traded off against the decoder BER performance, but tentative path metrics are not stored when $t=(c+1)D$. Instead, when $t=T+cD$, the state j having best path metric is selected and the contents of the survivor register, denoted by $E_{T+cDj}$, are output as the D decoded bits.

26 Claims, 19 Drawing Sheets

METHOD FOR IMPLEMENTING SHARED CHANNEL DECODER FOR ONBOARD PROCESSING SATELLITES

FIELD OF THE INVENTION

The present invention relates to method for implementing a single chip shared channel decoder supporting a multiplicity of variable bit rate carriers. More particularly, the present invention relates to a method for decoding an input signal comprising a plurality of channel symbols utilizing Viterbi decoding for use in onboard processing satellites in which trade-offs are made between memory for storing the survivor paths and bit error rate performance.

BACKGROUND OF THE INVENTION

Among several conventional algorithms for decoding convolutional codes, the Viterbi algorithm achieves maximum likelihood decoding and has been extensively utilized to improve the reliability of digital communication links. For each received channel symbol in an encoded input signal, the Viterbi algorithm initially computes a set of branch metrics. The branch metrics are then used by add/compare/select (ACS) units for computing and updating path metrics. For each state, in addition to the new path metrics, a sequence of decisions are made for the survivor paths and stored. When memory space is readily available and delay is not of any concern, the decoder can continue processing received data and output estimates for information bits at the end of message. In practice, however, messages are truncated and after a delay of T decoding steps, the decoder outputs estimates for information bits in a continuous mode.

There are two approaches to implement the truncated Viterbi algorithm. In a first approach, known as survivor exchange, the path metrics, as well as the survivor paths, are updated by the ACS operation and routed among the neighboring trellis states. As shown in FIG. 1, the subsystems of the truncated Viterbi algorithm decoder using the survivor exchange method comprise a branch metric calculator 11 for computing branch metrics $B_t$, a plurality of add-compare-select (ACS) units 12 for computing path metrics $\Gamma_t$ and survivor paths $E_t$, a memory 13 for storing new path metrics $\Gamma_t$ and the survivor paths $E_t$, and a memory 14 for storing path metrics $\Gamma_{t-1}$ and survived paths $E_{t-1}$, of prior trellis/decoding step t−1. For a code of rate ½ or its punctured versions, the truncation length T is about 60 to 120 bits. While this approach may provide savings in the required memory for storing survivor paths it entails a large interprocessor communication bandwidth and a large percentage of the chip area must be allocated to wiring.

In a second approach known as a traceback method, the sequence of survived paths are stored in a traceback RAM which is placed outside of the ACS units. As shown in FIG. 2, the subsystems of the truncated Viterbi algorithm decoder using the traceback method comprise a branch metric calculator 11 for computing branch metrics $B_t$, a plurality of ACS units 12, and a memory 23 for storing new path metrics $\Gamma_t$, a memory 24 for storing old path metrics $\Gamma_{t-1}$. Communications between each of the ACS units 12 and a traceback module (not shown) can be as small as one bit per decoder state per decoding step. Number of cells in the traceback RAM is a linear function of the product of number of decoder states S which equals $2^m$, where m is the memory order of the code, and the truncation length T.

Studies on the feasibility of VLSI implementation of a shared channel decoder (SCD) using the Viterbi algorithm have indicated that the maximum number of carriers processed by a single chip decoder is limited by the chip space allocated for storing the survived paths. This conclusion is valid for both the traceback method and the survivor exchange method for implementing a Viterbi algorithm decoder. The importance of RAM for storing surviving paths is emphasized by noting that it occupies about 50 percent of the chip area of a single channel decoder.

SUMMARY OF THE INVENTION

A decoding method and apparatus is presented which provides a high degree of flexibility allowing tradeoffs among such important system parameters as processing speed, required on-chip RAM, bit error rate (BER) performance, and throughput. The decoding method of the present invention uses the Viterbi algorithm for selecting survivor paths terminating on each trellis state. This decoding method is then applied for realization of a SCD. Several variations of the decoding method are examined for minimizing the required chip space of an Application Specific Integrated Circuit (ASIC) and optimizing the maximum number of channels. In a maximum likelihood shared channel decoding procedure, the ACS units must operate at 16×64 Kbps, or 1 Mbps for decoding a group of sixteen 64 Kbps channels. However, with the current CMOS technology, the same ACS units, occupying roughly the same amount of chip area, can operate more than 60 MHz. The decoding of the present invention method takes advantage of the high speed capability of processing elements for reducing the amount of memory required to store the survived paths.

For the special frequency plan and configuration of shared demodulators, considered for the onboard processing satellites, it is assumed that each channel is either a 64 Kbps carrier, or a 2 Mbps carrier, encoded by a convolutional code of rate ½ or its punctured version. In the midband section, it is assumed that frequency is planned so that each demodulator either demodulates only one 2 Mbps carrier or up to sixteen 64 Kbps carriers. The BER performance of the proposed decoding algorithm is evaluated by computer simulations. Feasibility of a single chips SCD for simultaneously decoding up to sixteen 64 Kbps channels is examined for the midband. For the sidebands, a SCD using MLD is proposed since there are at most six 2 Mbps carriers in these bands.

The required chip space can be minimized by selecting an architecture which is based on parallel processing of states and bit serial communications among the neighboring states. While the decoding method of the present invention is intended for an onboard processing satellite, it can certainly be also used in satellite or terrestrial earth stations receiving several low bit rate channels.

BRIEF DESCRIPTION OF THE DRAWINGS

These and other features, aspects and advantages of the present invention will become better understood with reference to the following detailed description, appended claims, and accompanying drawings, wherein:

DETAILED DESCRIPTION OF THE PREFERRED EMBODIMENTS

Figure 1:
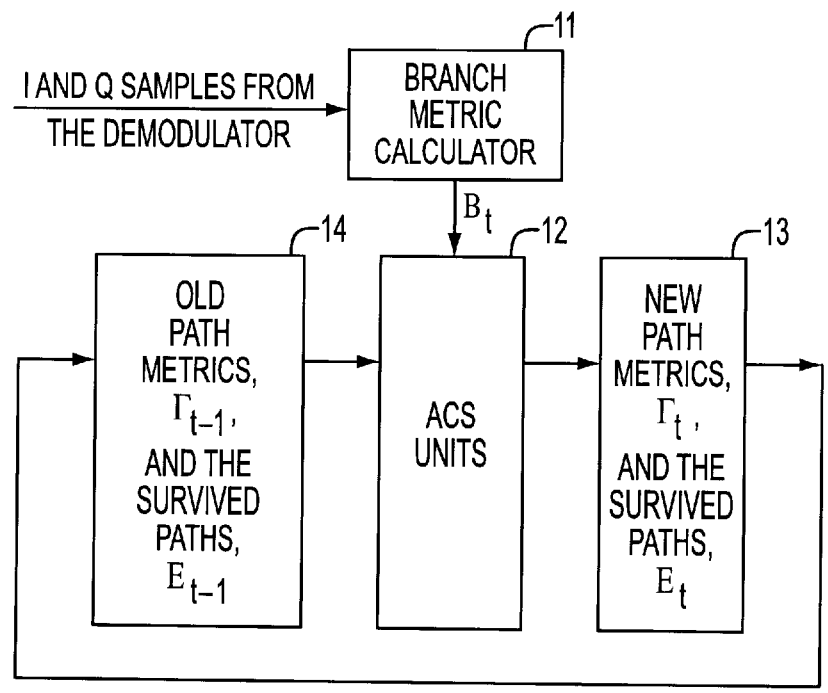
FIG. 1 is a block diagram of a truncated Viterbi Algorithm decoder using the survivor exchange method.
Figure 2:
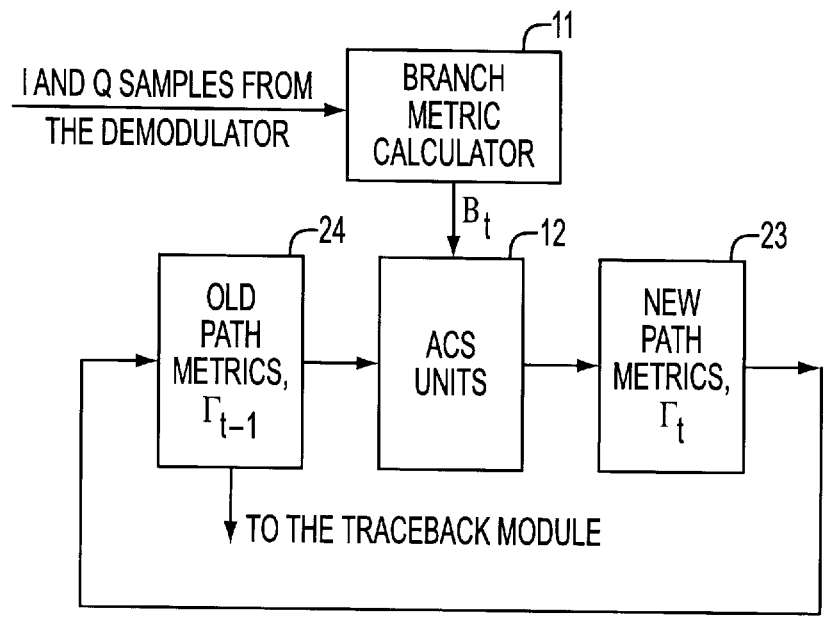
FIG. 2 is a block diagram of a truncated Viterbi Algorithm decoder using a traceback module.

The following is a brief review of convolutional coding and Viterbi algorithm decoding presented to introduce notations and typical numerical examples used herein. A binary convolutional code rate R=k/n consists of an m-stage binary shift register where k is the number of bits in an input data block received by the encoder and n is the number of symbol blocks output by the encoder. An encoder constraint length is defined as K=m+1 where m is the memory order of the code. Data is input to the shift register one bit at a time and the two outputs are linear functions of the shift register contents. Codes of arbitrary rates can be derived from the rate of R=½ code by using the puncturing technique. The set of m-stage binary shift register contents can be represented by $S=2^m$ states where S is number of decoder states. For example, S=64 when m=6.

The set of all codewords generated by the convolutional code of rate ½ can be represented by trellis diagram having S states. At each trellis/decoding step, exactly two branches terminate on each state and exactly two branches stem from each state. The quadrature components of the received and demodulated symbols are quantized to b=3 bits. At trellis step t, the decoder finds the path which closest to the received sequence and stores a metric for the selected path. Typically, path metrics are represented by p=5 bits. The SCD method of the present invention stores only D bits for each survived path using the survivor exchange technique, but by reprocessing the received sequence η=T/D times achieves the equivalent performance to that of a traceback decoder using a truncation length of T bits.

Assuming that the SCD is capable of decoding at most N simultaneously active frequency division multiple access (FDMA) carriers conveying $R_b$ kbps, the required decoding speed or aggregate trellis steps V which must be processed in one second is represented by the equation $V=NR_bT/D$, where T=60, D=6 and N (the maximum number of channels decoded by the shared channel decoder)=16. It is important to note that V is significantly less than the processing speed of current CMOS technology.

In the conventional survivor exchange technique, the survived paths and the branch metrics are exchanged after each trellis/decoding step. Maximum clock rate Cps for bit serial exchange of shift registers storing path metrics and survivor paths is equal to $(D+p)R_b\eta$ which is about 7 MHz where D=6, p=5, $R_b$ (information bit rate per channel)=64 Kbps, and η=10. However, Cps is substantially less than the maximum achievable clock rate inside the chip, which typically is more than 50 MHz.

As discussed above, the SCD processes a received sequence of channel symbols η times. Hence, the memory required for storing branch metrics for T+D trellis steps is B=(bn)(T+D)N wherein b is the number of bits for representing metrics for the I or Q component of a channel symbol, and where n=2 is the number of channel symbols (I or Q components) per trellis step.

Figure 3:
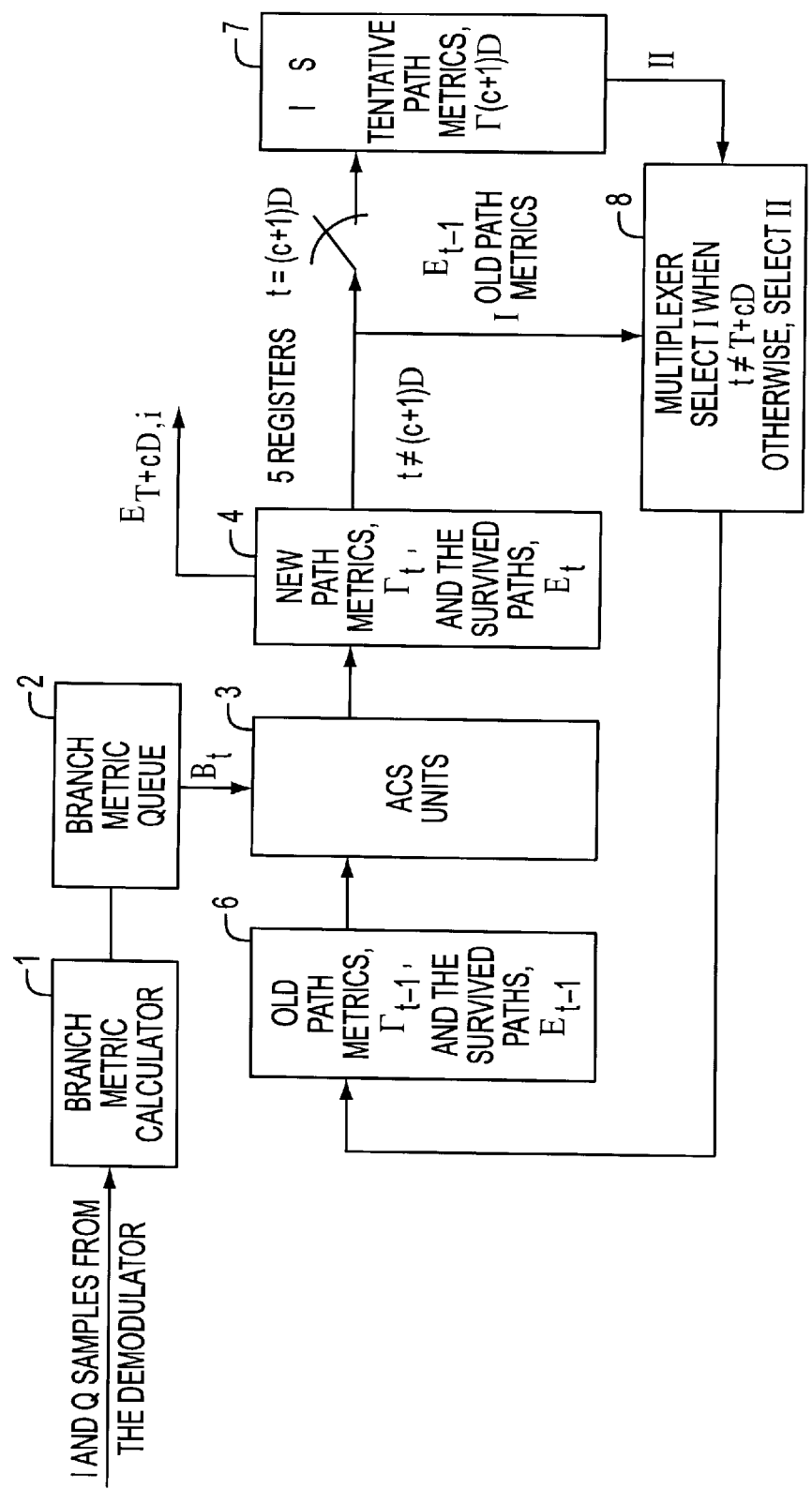
FIG. 3 is a block diagram of a truncated Viterbi Algorithm decoder according to a first embodiment of the present invention.
Figure 4:
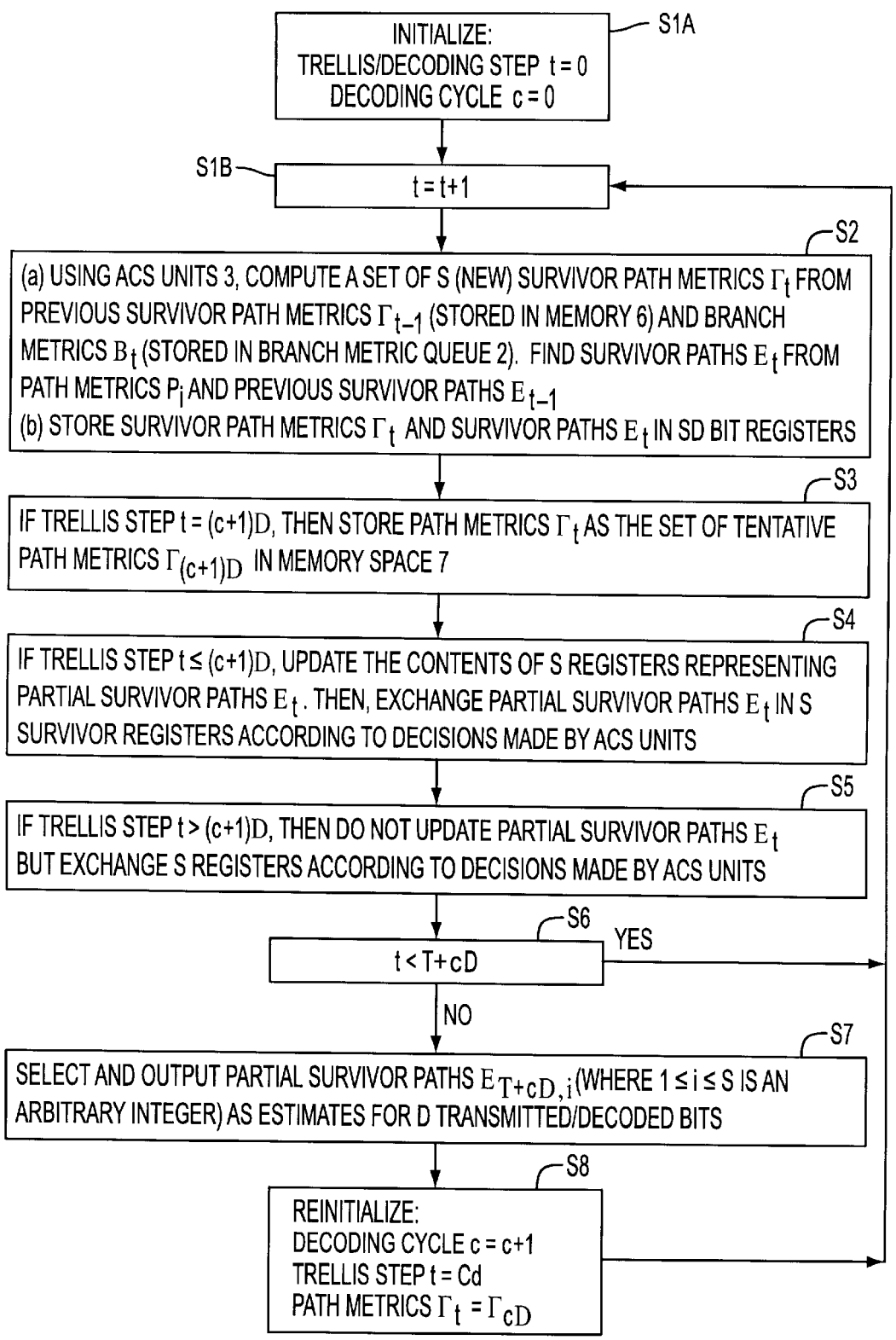
FIG. 4 is a flowchart of the method of implementing a truncated Viterbi Algorithm decoder according to a first embodiment of the present invention.

With reference to FIGS. 3 and 4, a decoding method of a first embodiment of the present invention is described below. As shown in FIG. 3, the subsystems of the shared channel decoder of a first embodiment of the present invention include a branch metric calculator 1 for calculating branch metrics $B_t$, a plurality of ACS units 3 for computing and exchanging new path metrics $\Gamma_t$ and survivor paths $E_t$, a memory (RAM) 4 for storing new path metrics $\Gamma_t$ and survivor paths $E_t$, and a memory (RAM) 6 for storing previous path metrics $\Gamma_{t-1}$ and previous survivor paths $E_{t-1}$. Note that the branch metrics $B_t$ is the set of branch metrics for decoding step t (e.g., for a code rate of ½, $B_t=\{B_{t,00}, B_{t,01}, B_{t,10}, B_{t,11}\}$), the path metrics $\Gamma_t$ is the set of S survivor metrics $\{\gamma_{t,1}, \gamma_{t,2}, \ldots, \gamma_{t,S}\}$ at decoding step t and the survivor paths $E_t$ is the set of S survivor metrics $\{E_{t,1}, E_{t,2}, \ldots, E_{t,S}\}$ where S is the number of decoder states. These subsystems function in the same manner as a truncated Viterbi decoder using the survivor exchange method shown in FIG. 1. In addition, the shared channel decoder includes a branch metric queue 2 for storing branch metrics $B_t$, a tentative path metric memory 7 for storing tentative path metrics $\Gamma_{(c+1)D}$, and a multiplexer (selector) 8 for selecting the previous path metrics $\Gamma_{t-1}$ when t≠T+cD, and selecting the tentative path metrics $\Gamma_{(c+1)D}$ when t=T+cD. An important advantage of the decoding method of the present invention is that the number of bits D stored in each partial survivor register in memory 6 is much less than truncation length T employed in conventional Viterbi decoders and a separate RAM is not required for traceback. In addition to the above subsystems, the decoder stores a set of S tentative path metrics $\Gamma_{(c+1)D}$ and a sequence of branch metrics L=n(T+D) for the most recently received I and Q components of the received channel symbols.

The decoder begins a first decoding cycle by processing the received channel symbols for D trellis/decoding steps t in the same manner as a truncated Viterbi algorithm decoder using the survivor exchange method where t is a semi-infinite indicator for time, from 0 to infinity. Initially, as shown in FIGS. 3 and 4, the trellis/decoding step t and the decoding cycle c are set to 0 in step S 1A and then the trellis decoding step t is incremented by one in step S 1B. In step S 2, for trellis/decoding steps t=cD+1 to (c+1)D (i.e., steps t=1 to D for the first decoding cycle c=0), the path metrics $\Gamma_t$ and the survivor paths $E_t$ are computed and the survivor paths $E_t$ are stored and exchanged in the S D-bit registers according to the decisions made by the ACS units 3. At the end of the trellis/decoding step t=(c+1)D, path metrics $\Gamma_{(c+1)D}$ are stored in the tentatative path metric memory 7 in step S 3. From trellis/decoding steps ((c+1)D)+1 through cD+T (i.e., steps t=D+1 through T for the first decoding cycle c=0), the decoder continues processing the received channel symbols, updating the path metrics, and exchanging the survivor paths stored in the S registers according to decisions made by the ACS units (steps S 4 and S 5). However, the survivor paths stored in the S D-bit registers are not updated during this period because D is less than T and the memory space of the S registers is already fully employed. At the end of cD+T trellis/decoding steps (i.e., step t=T for the first decoding cycle c=0), an arbitrary one $D_{T+cD,i}$ of the survivor paths $E_t$ stored in the S D-bit registers is selected and output as an estimate for transmitted D information bits, where i is an arbitrary integer between 1 and S inclusive. Alternatively, at the end of cD+T trellis/decoding steps, as determined in step S 6, the path metrics $\Gamma_t$ are compared and the survivor path $E_{T+cDj}$ (where j is the state with best path metric) is selected and output as estimates for transmitted D information bits in step S 7. A new cycle begins in step S 8.

The decoder begins the second decoding cycle c=1 by calculating the path metrics $\Gamma_t$ using the tentative path metrics $\Gamma_{(c+1)D}$ stored in the first decoding cycle and processing branch metrics $B_t$ for trellis steps D+1 through T+D. All of the decoding cycles, c>1, are performed in the same manner as summarized in FIG. 4. Moreover, the decoder is designed for operation in continuous mode and the algorithm never stops decoding.

While the bit error rate (BER) performance of the decoding method of the present invention is the same as a truncated Viterbi decoder with a truncation length of T, the required memory for storing survivor paths is substantially less since D is less than T. This is achieved at the expense of a lower decoding throughput (each received channel symbol is decoded 7 times resulting in a decoding throughput of $1/\eta$, where for simplicity of notations and analysis it is assumed that T=$\eta$D where $\eta$ is an integer greater than or equal to 1).

The total RAM (per channel), $\sigma_{RAM,A1}$, required for implementing the decoding method of the first embodiment of the present invention is the sum of RAMs for storing L branch metrics, (each n×b-bits for a total of B=nbL bits), plus path metrics, tentative path metrics, plus partial survivor paths.

$$\sigma_{RAM,A1}=B+pS+pS+DS=B+(2p+D)S.$$

In addition, the decoder needs to store D bits of partial survivor paths at the output of the S units. This storage is usually implemented by D bit D-type flip-flops (D-FF). Hence, a total of $\delta_{FF}$=DS bits of D-FF is required for this purpose.

Each ACS unit, including D-FF for storing new path metric, can be implemented by $C_{ACS}$=250 gates. And we assume that ROM for realization of branch metric look-up table can be implemented by $G_{ROM}$=574 gates. Finally assuming that each D-FF can be implemented by 5 gates and each bit of RAM taking 2.5 gates, the total number of gates for implementing the decoding method of the first embodiment is represent by the following equation:

$$G_{total}=2.5\times\sigma_{RAM,A1}+5\times\delta_{FF}+G_{ROM}+G_{ACS}\times S.$$

In a shared channel decoder, the ACS units, D-FFs, and the ROM branch metric table look-up can be used for the N channels. However, $\sigma_{RAM}$ bits of RAM must be allocated for each channel. Therefore, total number of gates for an N channel decoder is $$G_{total,N}=2.5\times N\times\sigma_{RAM}+5\times\delta_{FF}+G_{ROM}+G_{ACS}\times S$$

Figure 7:
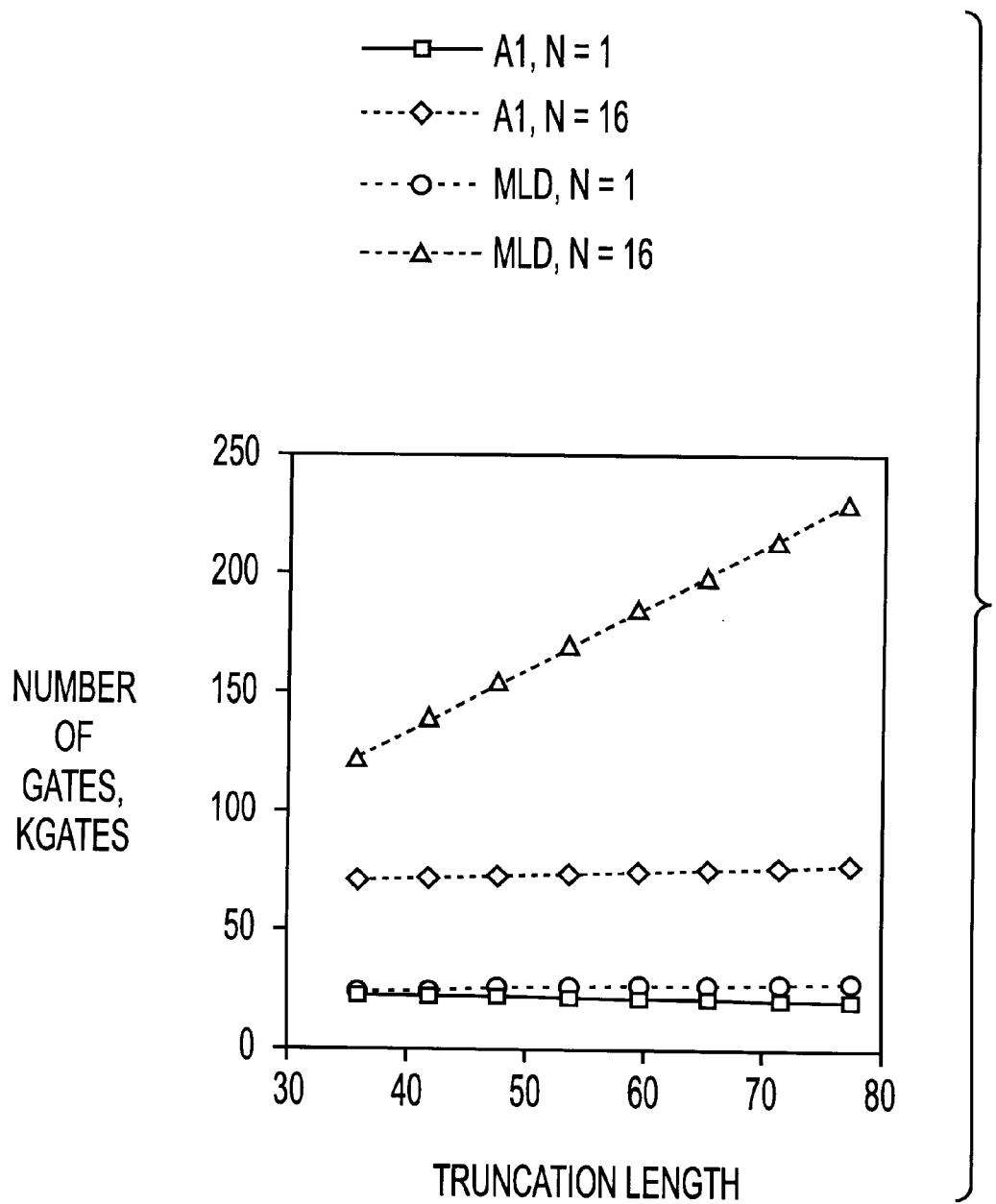
FIG. 7 is a graph illustrating the number of gates vs. truncation length for the decoding method of the first embodiment of the present invention.

The required number of gates versus T for a single channel decoder and a 16 channel shared channel decoder chip are plotted in FIG. 7 for decoding method of the first embodiment (A1) and a maximum likelihood decoder (MLD). In the MLD, the number of gates rapidly increases as truncation length T and the number of channels are increased. However, the proposed decoding method is not sensitive to T and N.

In Table 1 (below) the complexity of implementation of the decoding method of the first embodiment is compared with the complexity of a truncated Viterbi decoder when decoding a single channel. For a truncation length of 60 steps, a 16 channel shared MLD needs more than 183,000 gates while a shared decoder using the decoding method of the first embodiment requires about 70,000 gates for decoding the same number of channels. For many applications, especially for satellite of terrestrial earth stations receiving several low bit rate carriers, the 70,000 gates can be readily placed in a single chip.

TABLE 1

Complexity Analysis for the Decoding Method of the First Embodiment (A1), the Decoding Method of the Second Embodiment (A2), and a MLD

| Subsystems and Performance Criteria | A1 | A2 | MLD |
|---|---|---|---|
| ROM for branch metric look-up table | $G_{ROM}$ | $G_{ROM}$ | $G_{ROM}$ |
| Number of ACS units | 64 | 64 | 64 |
| Processing speed of ACS units | $\eta$V | $\eta$V | V |
| RAM for storing branch metrics | $B_R$ | $B_R$ | 0 |
| RAM for storing path metrics | $P_S$ | $P_S$ | $P_S$ |
| RAM for storing tentative path metrics | $P_S$ | 0 | 0 |
| RAM for storing survivor paths | 0 | 0 | T |
| D-type flip-flops for implementing survivor registers | DS | DS | 0 |
| Decoding delay | T | T | T |
| Performance loss relative to a MLD | 0 | * | 0 |
| Total number of gates per channel when $T_R$ = 60 | 21,714 | 20,914 | 27,334 |
| Total number of gates for 16 54 Kbps channels: $T_R$ = 60 | 70,014 | 57,214 | 183,334 |

*Performance loss of the Decoding Method of the Second Embodiment (A2) relative a MLD depends on several important parameters such as code rate R, length of partial survivor registers D, and truncation length T.

Figure 5:
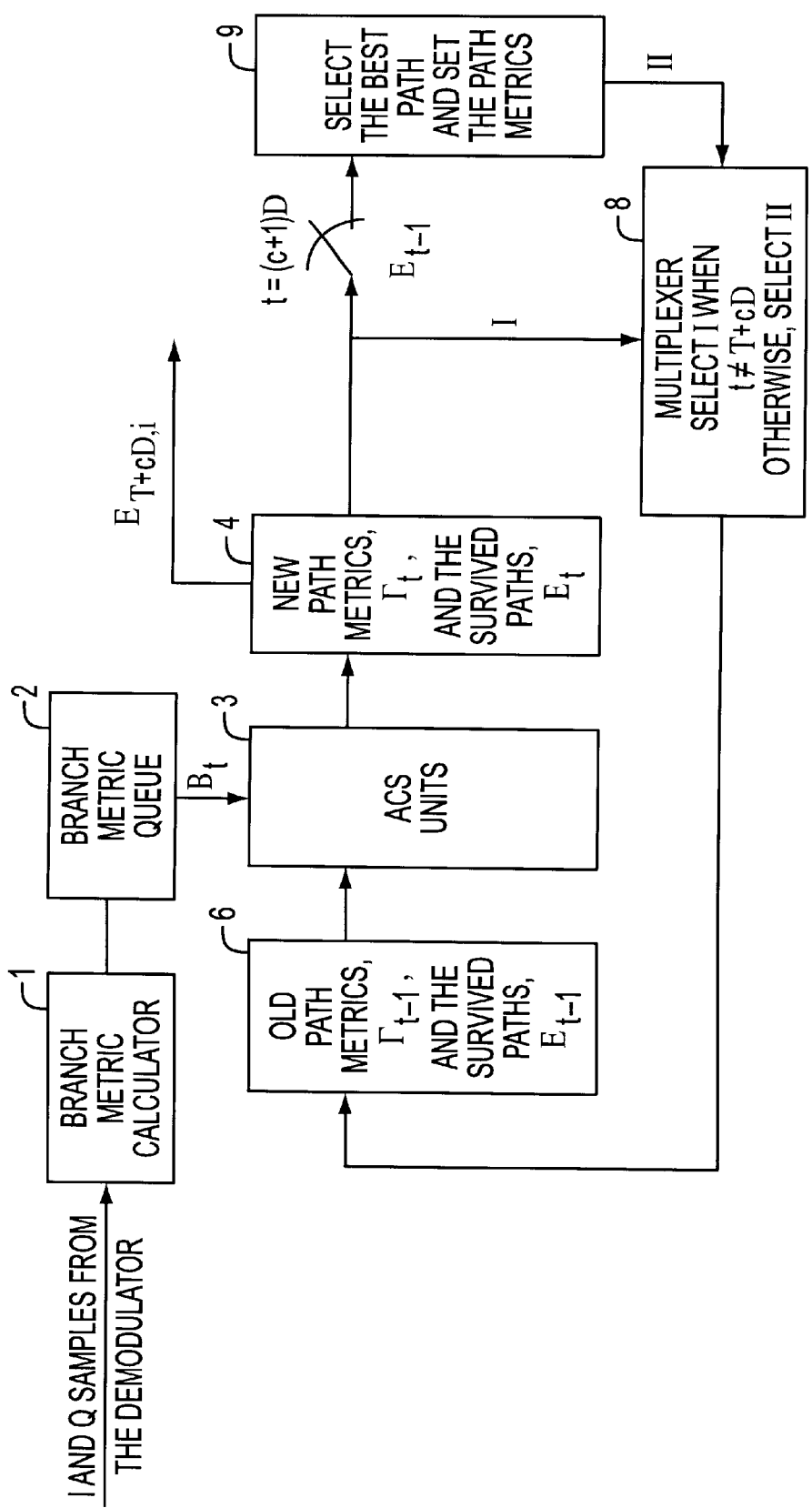
FIG. 5 is a block diagram of a truncated Viterbi Algorithm decoder according to a second embodiment of the present invention.
Figure 6:
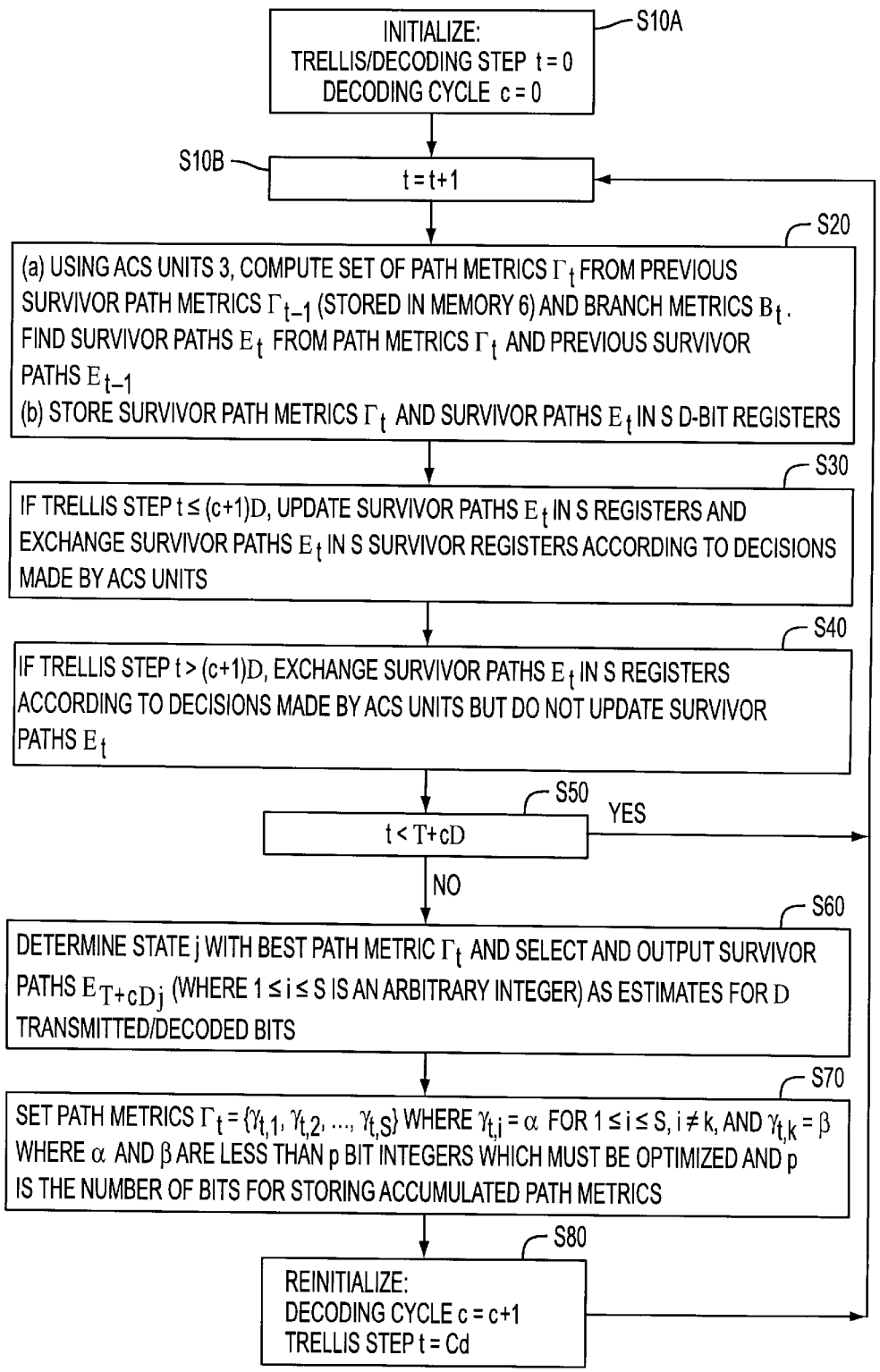
FIG. 6 is a flowchart of the method of implementing a truncated Viterbi Algorithm decoder according to a second embodiment of the present invention.

With reference to FIGS. 5 and 6, a decoding method of a second embodiment of the present invention is described below. In the second embodiment of the decoding method of the present invention, the size of required RAM is traded off against the decoder BER performance. The decoding method of the second embodiment takes almost the same steps as the first embodiment for decoding the received channel symbols, and steps. However, as summarized in FIG. 5, tentative path metrics are not stored when t=(c+1)D. Instead, as seen by a comparison of step S 3 of FIG. 4 and step S 30 of FIG. 6, when t=T+cD, the state j having best path metric is selected and the contents of the survivor register, denoted by $E_{T+cDj}$, are output as the D decoded bits in step S 60. The m least significant bits (where m is the memory order of the code) of $E_{T+cDj}$ identify the state k at decoding time cD over the selected survived path, where k is decimal equivalent of m least significant bits of $E_{T+cDj}$, plus one. Before beginning the next decoding cycle, in step S 70, the decoder reinitializes the set of path metrics $\Gamma_t=\{\gamma_{t,1}, \gamma_{t,2}, \ldots, \gamma_{t,S}\}$ as $\gamma_{t,i}=\alpha$ for $1\leq i\leq S$, i≠k, and $\gamma_{t,k}=\beta$, where $\alpha$ and $\beta$ are less than p bit integers (positive or negative) which must be optimized according to the transmission channel environment, where p is the number of bits for storing accumulated survivor path metrics. The new cycle begins in step S 80.

The total RAM required for the decoding method of the second embodiment (A2) is represented by the following equation, $\sigma_{RAM,A2}=B_R+pS+DS=B_R+(p+D)S$, which is less than total RAM $\sigma_{RAM_{A1}}$ required for the decoding method of the first embodiment by pS bits. Saving pS bits of memory is negligible for a single channel decoder but saving NpS bits of RAM is significant for a shared channel decoder when the maximum number of channels N decoded by the shared channel decoder is large.

Figure 8:
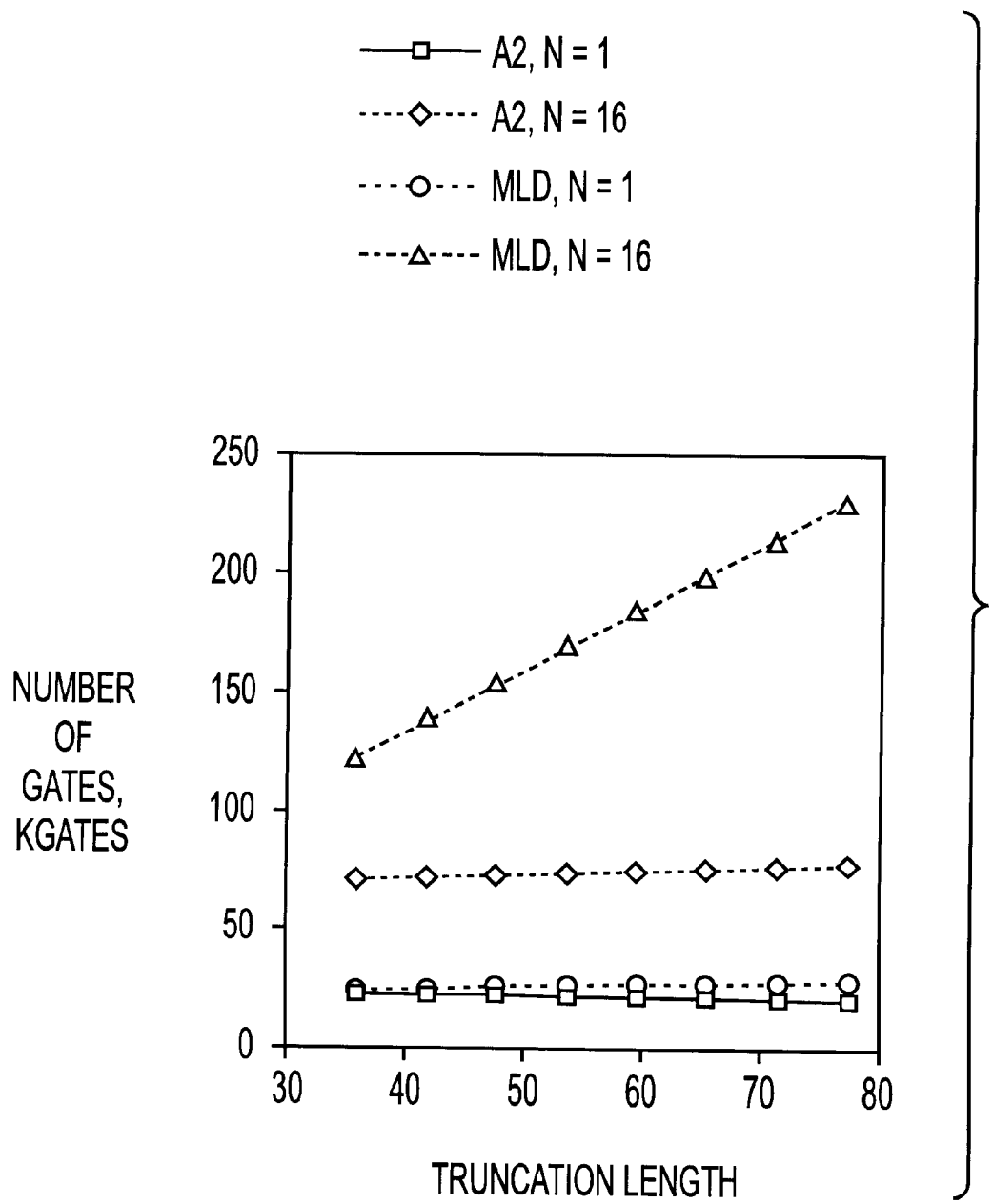
FIG. 8 is a graph illustrating the number of gates vs. truncation length for the decoding method of the second embodiment of the present invention.

FIG. 8 compares sensitivity of MLD and the decoding method of the second embodiment (A2) with respect to the truncation length T for a single channel and when N=16. Complexity of implementation of the decoding method of the second embodiment is almost independent of T.

A rough complexity analysis for a SCD using the decoding method of the second embodiment is also included in Table 1. When N=16, a SCD requires about 57,000 gates.

Figure 9:
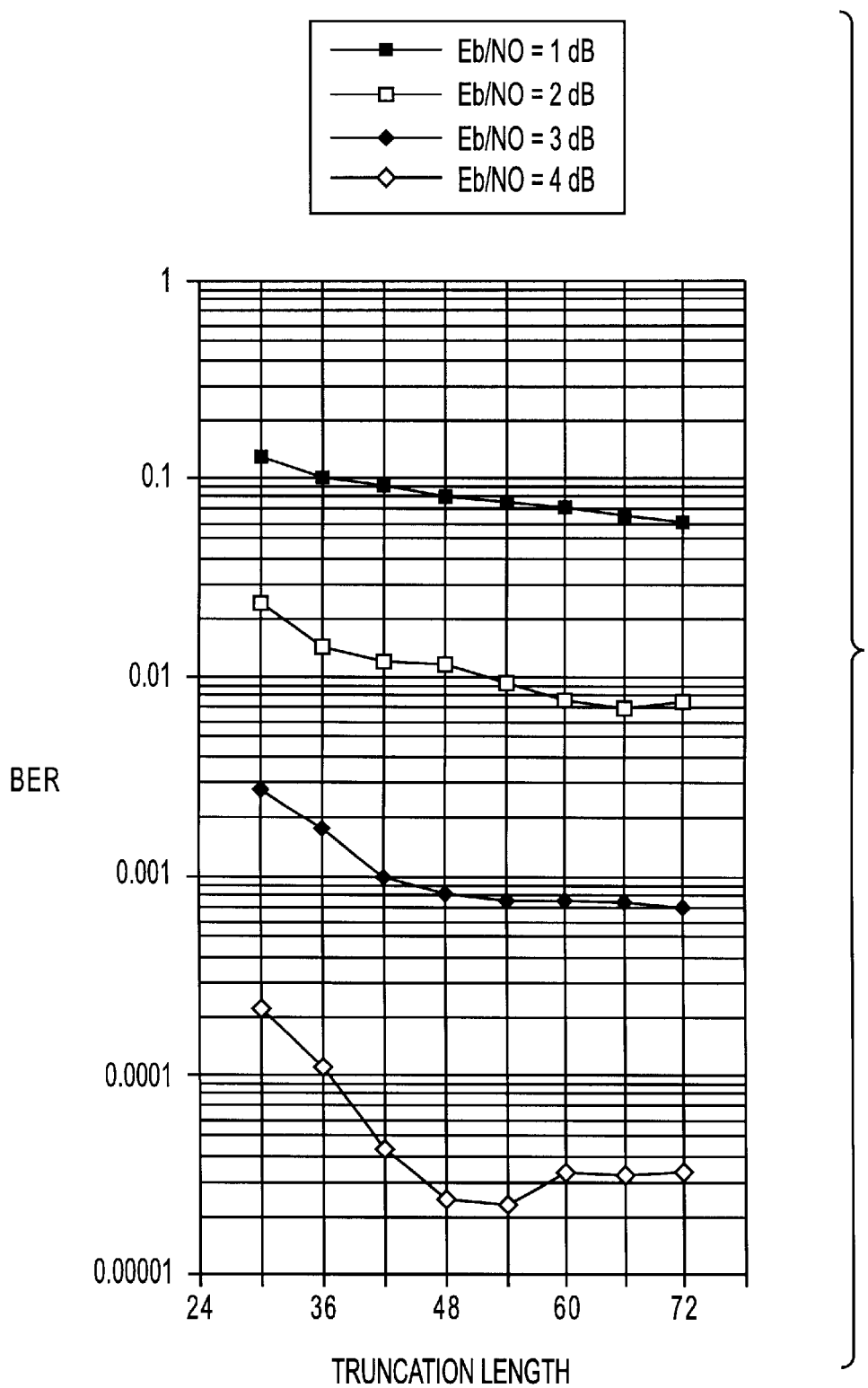
FIGS. 9–13 are graphs illustrating BER performance for different truncation lengths for the decoding method of the first embodiment of the present invention.
Figure 10:
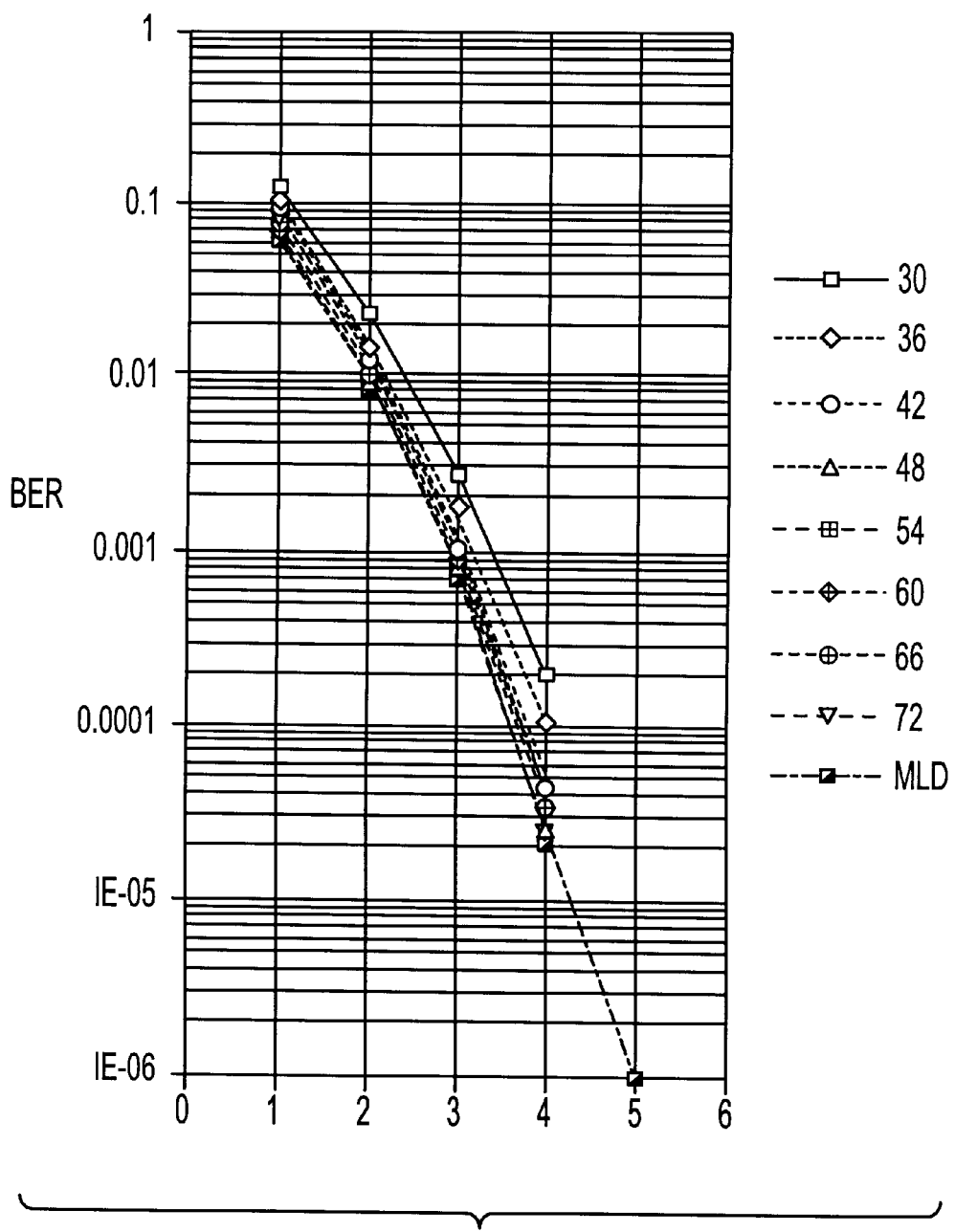
Figure 11:
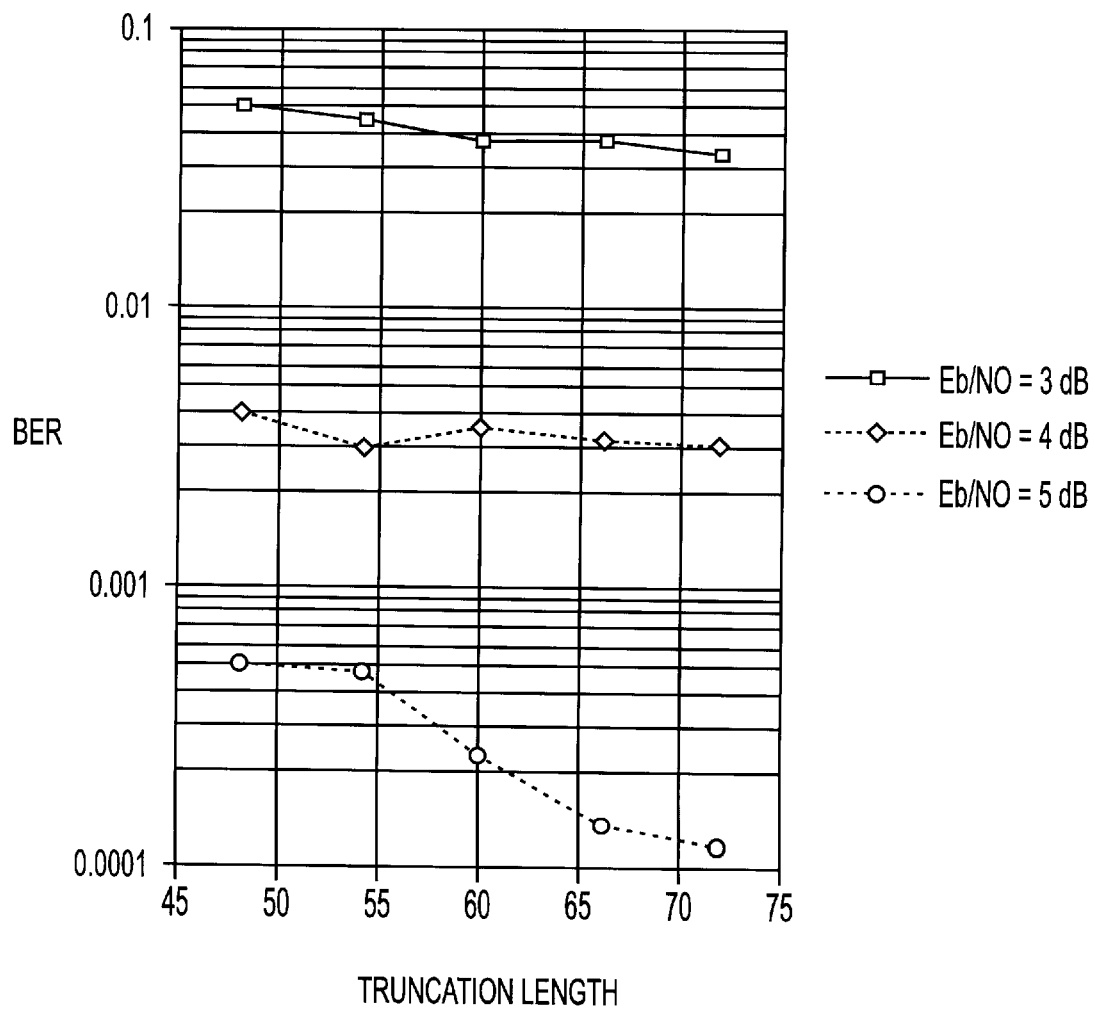
Figure 12:
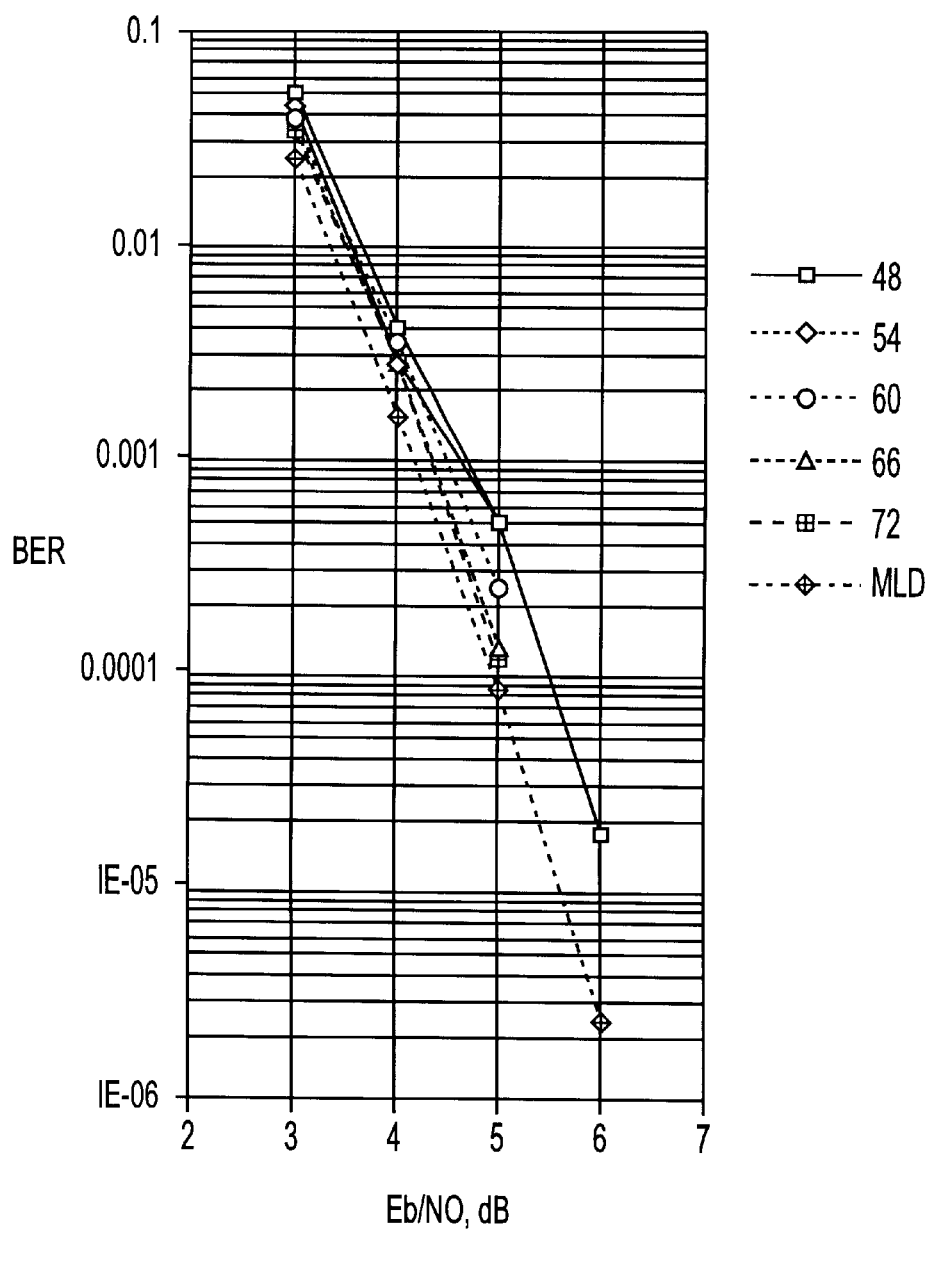
Figure 13:
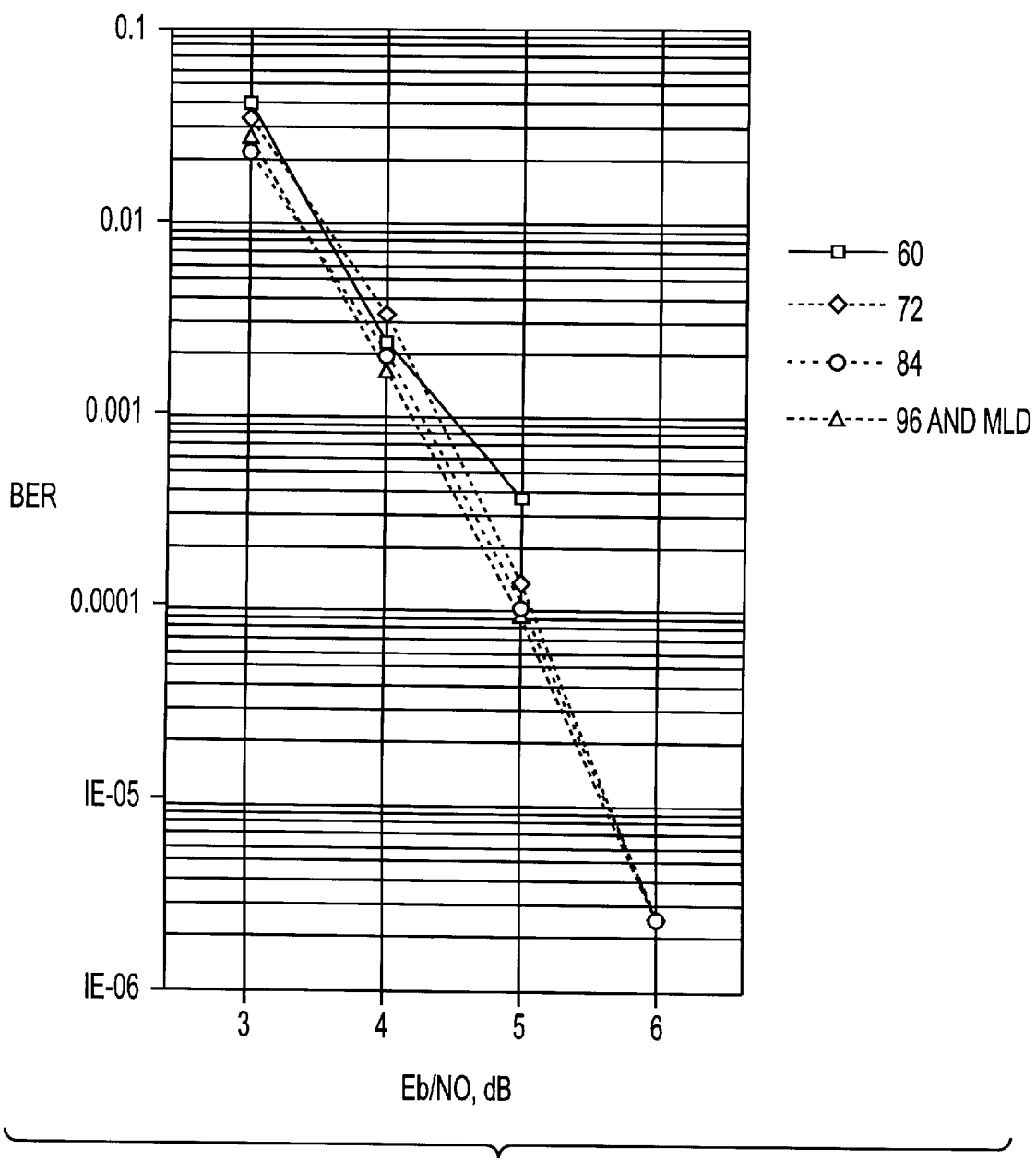
Figure 14:
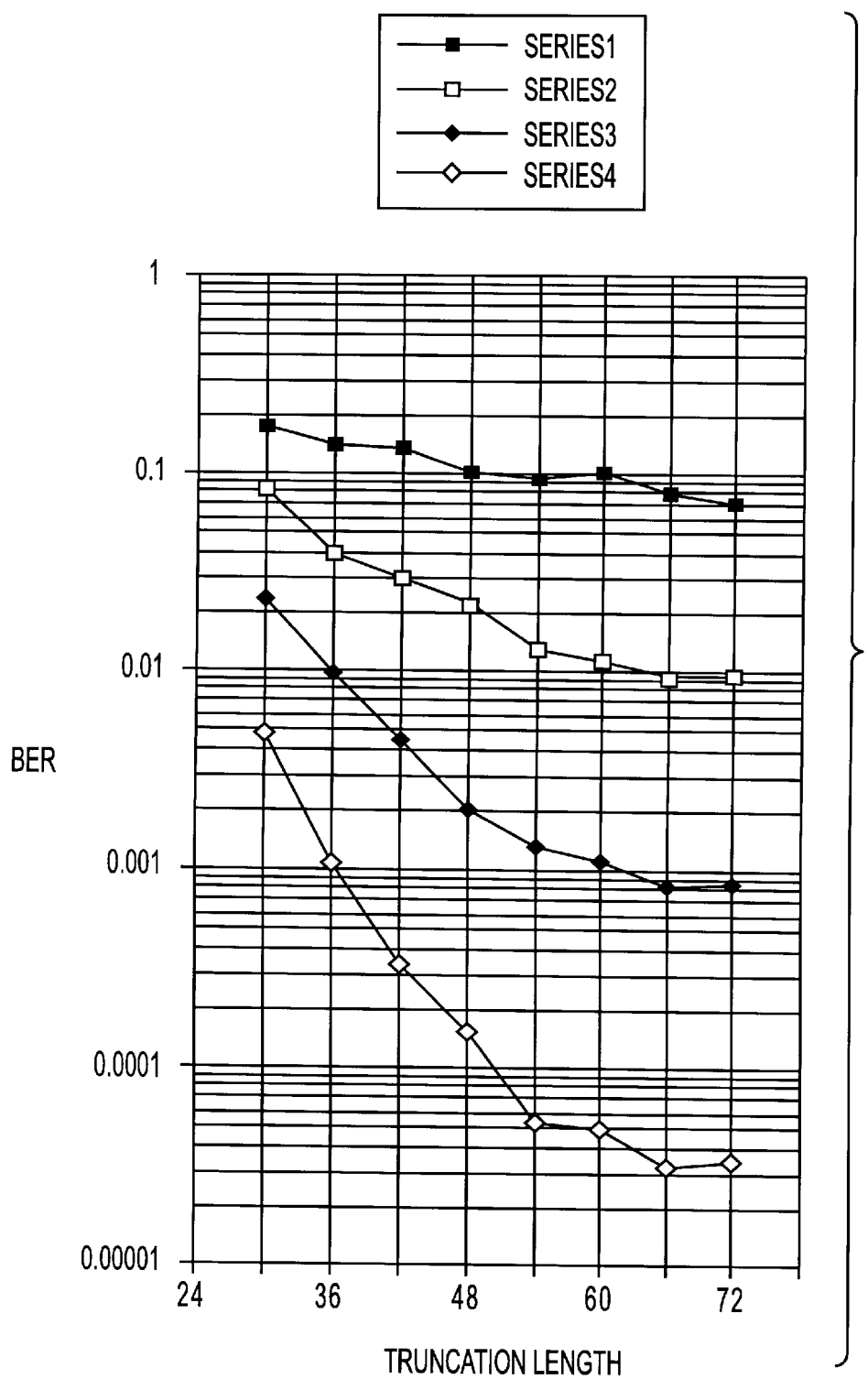
FIGS. 14–18 are graphs illustrating BER performance for different truncation lengths for the decoding method of the second embodiment of the present invention.
Figure 15:
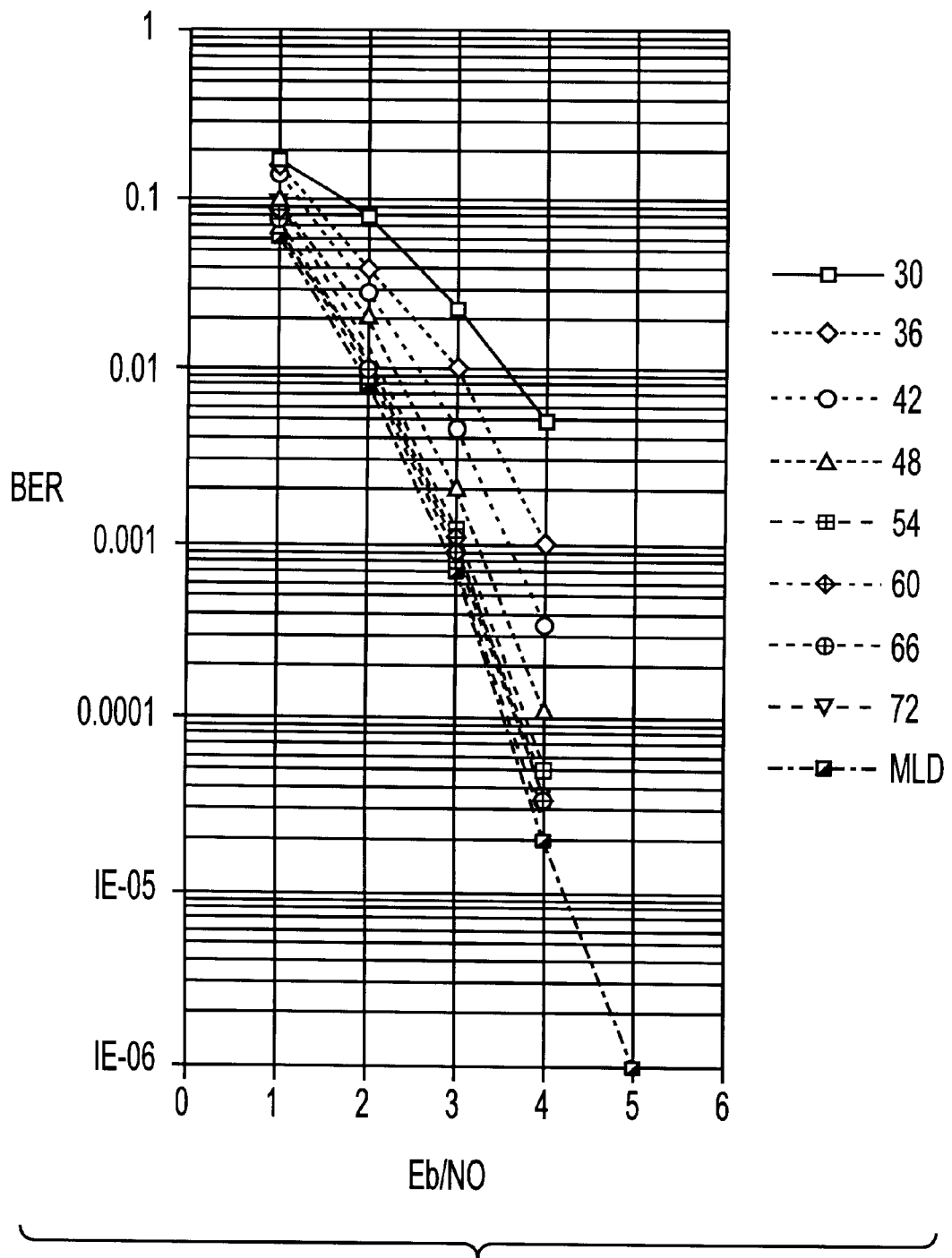
Figure 16:
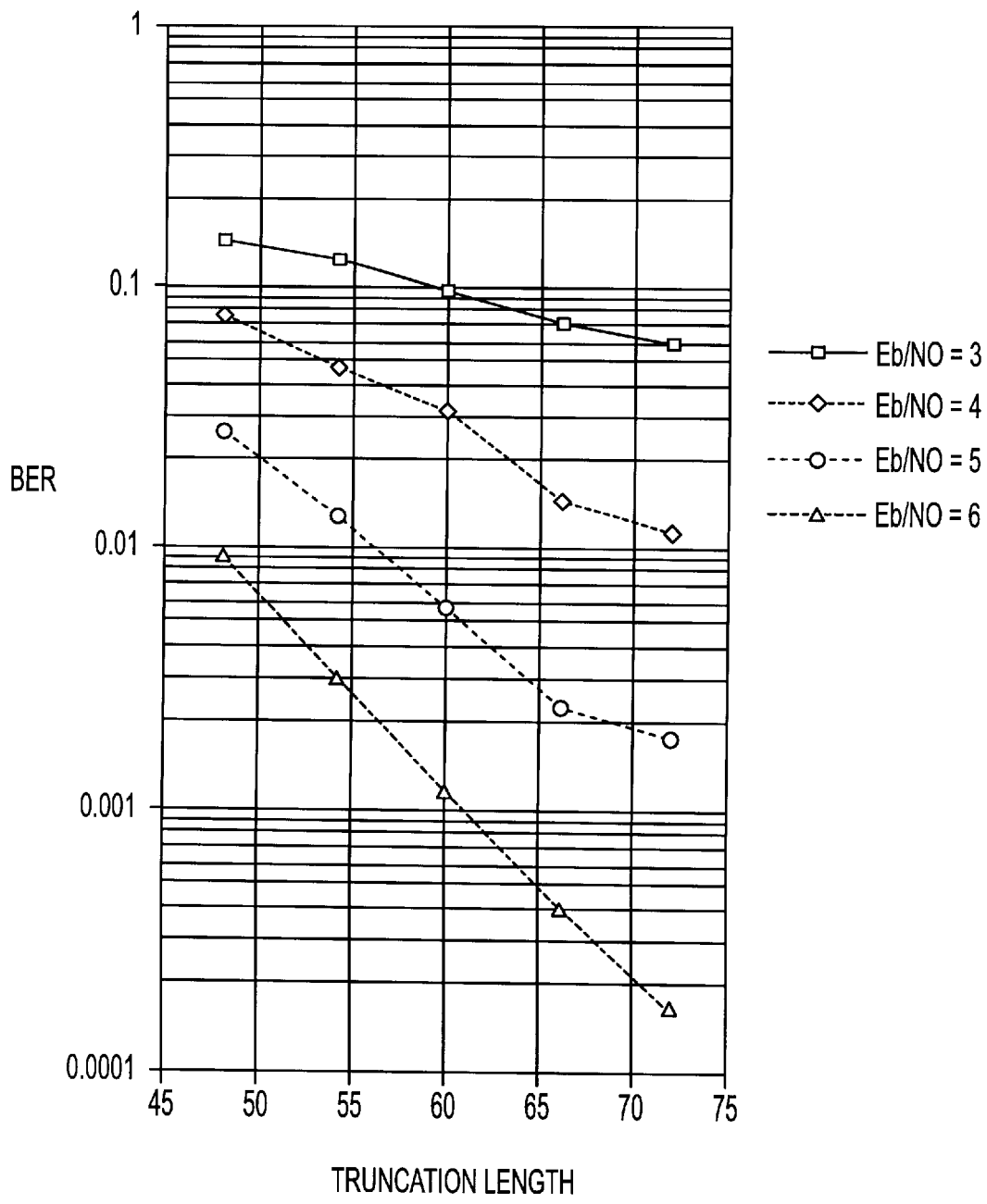
Figure 17:
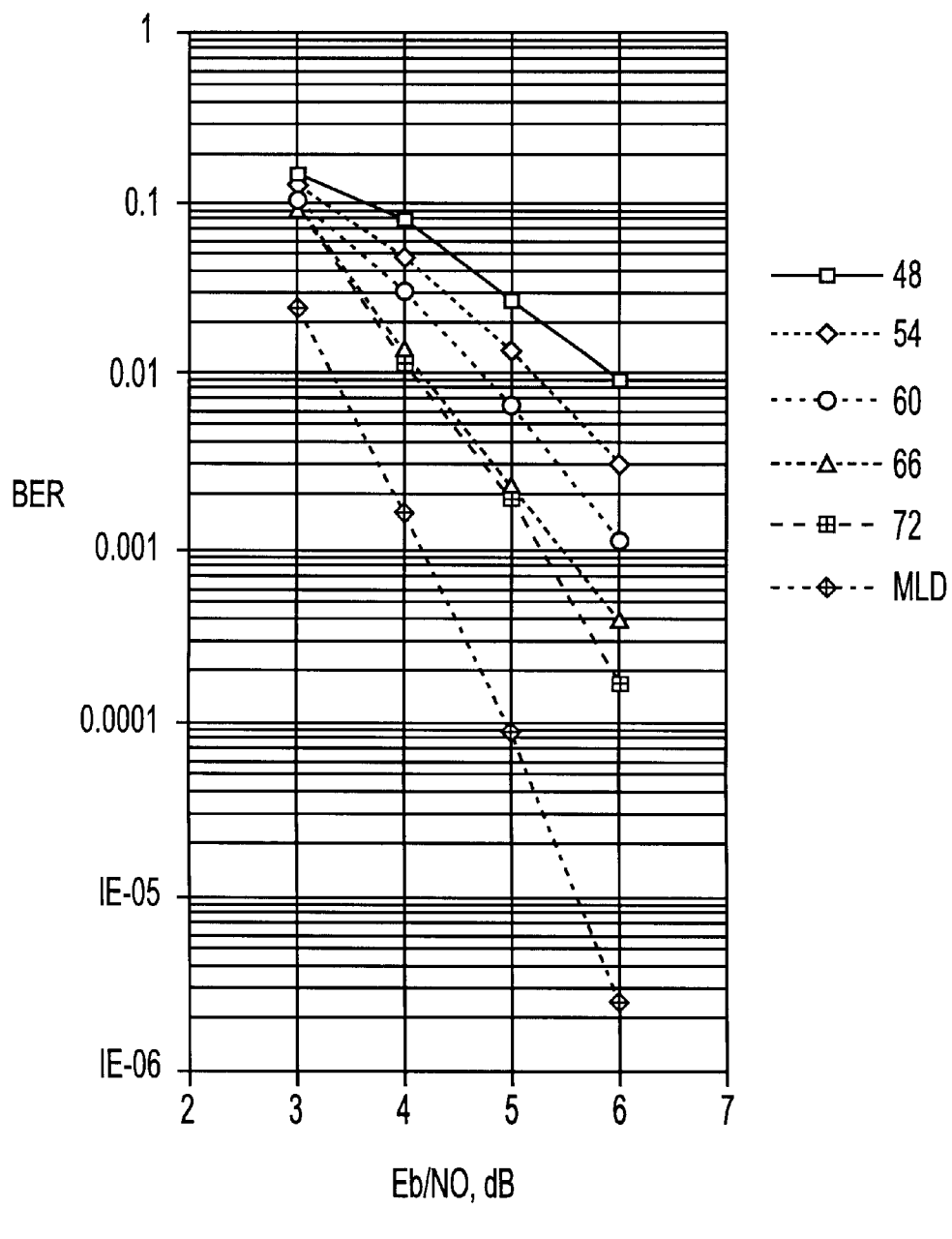
Figure 18:
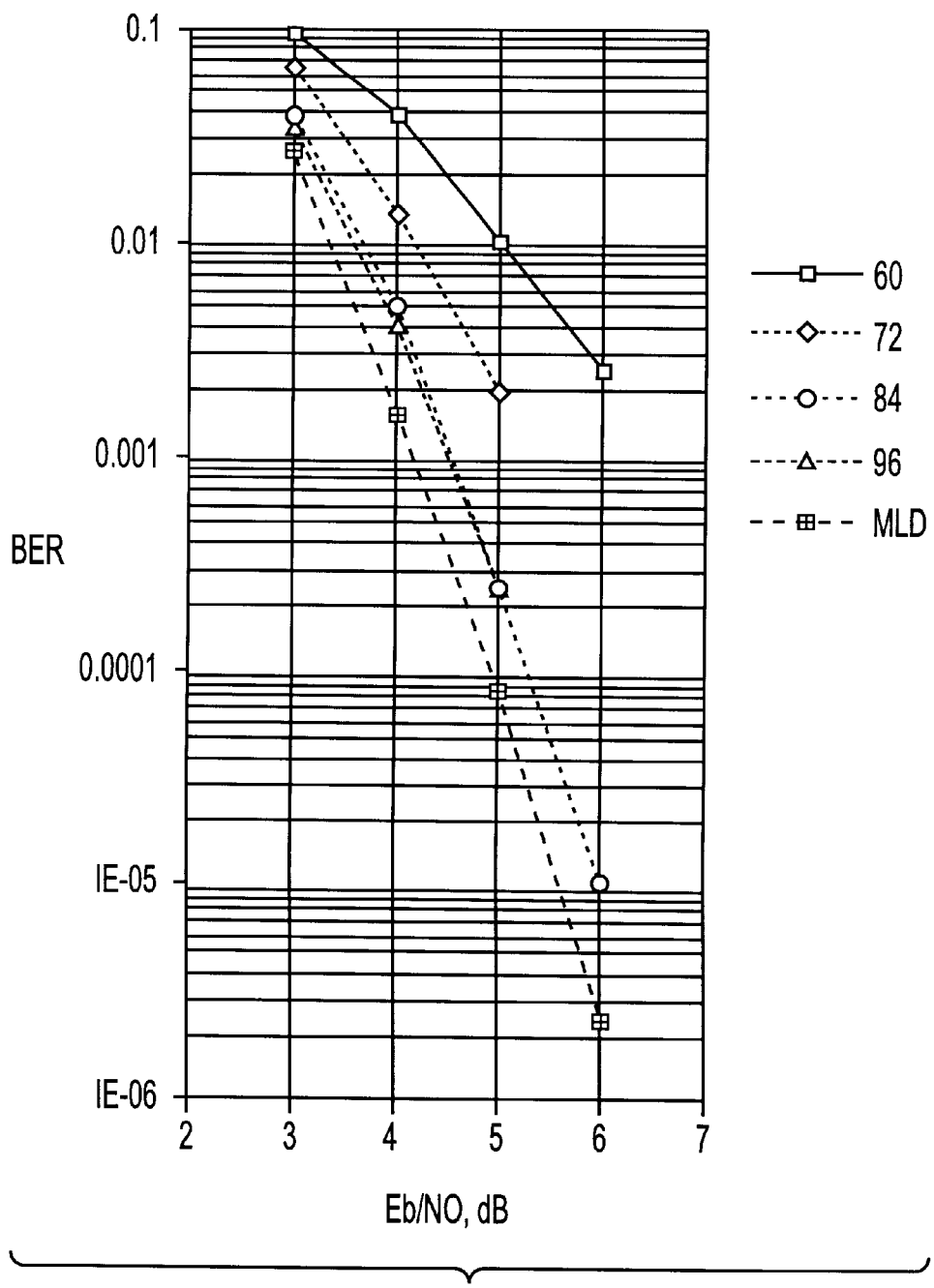

Computer simulations demonstrate tradeoffs among important parameters in the decoding method of the second embodiment (A2); BER performance vs. D and T for the K=7 convolutional code of rate ½ and its punctured version of rate ¾. FIG. 9 shows BER performance vs. truncation length parametric in $E_b$/No when D=m=6 and R=½. The decoder selects the state with best metric for decoding a block of D bits. In the simulations, all the path metrics except the best one, were reinitialized to zero ($\alpha$=0 and the best path was reinitialized to −7 ($\beta$=−7). The BER performance degradations are negligible when T≧42 as also indicated in FIG. 10. In this case the ACS processors must operate $\eta$=T/D=42/6=7 times faster than a MLD. FIG. 11 shows the same results as those of FIG. 6 but for a punctured code of rate ¾. As shown in this figure and FIG. 12 degradations in BER performance are negligible, about 0.2 dB, when T≧66. The ACS units must operate at $\eta$=T/D= 66/6=11 times faster than a MLD. FIG. 13 shows BER performance vs. $E_b$/No for a code of rate ¾ parametric in T when D=12. Degradations in BER performance relative to the performance of a MLD is negligible when T=72. In this case t=72/12=6. However, the decoder needs to store D=12 bit partial survivors instead of D=6 bits.

FIGS. 14 through 18 show the same tradeoffs as FIGS. 9 through 13 when the decoder selects an arbitrary state instead of the best state. Close inspection of these figures reveals that the BER performance improves as truncation length is increased. Also, performance improves as partial survivor length D is increased. While the code of rate ½ performs well when D=6, the performance of punctured code demonstrates some degradations. This is due to the fact that for short D the code of rate ½ has a relatively large Hamming distance among unmerged paths. However, the punctured code of rate ¾ does not accumulate sufficient distance among unmerged paths and cannot tolerate frequent reinitializations of the path metrics when the survivor path is randomly selected. Therefore, for high rate codes it is recommended to select the best metric when D is small. Circuitry for selecting best state does not occupy much space of the decoder chip.

Samples generated at the output of the group demodulator are grouped into frames each frame being several hundreds of msec. In each frame there are tens of consecutive samples for a given channel. Each modulation symbol is represented by two samples. The number of samples per channel per frame is not a constant. That is in one frame there might be 8 symbols for channel number 1 and in the next frame there might be 9 symbols for the same channel. The number of symbols per frame also depends on the channel code rate.

For the 64 Kbps IDR/IBS carriers encoded by a code of rate ¾, there are fewer symbols per frame than for carriers encoded by a code of rate ½. Each demodulated symbol is represented by its I and Q components as well as a multiplicity of bits for identifying their corresponding channel.

The shared channel decoder must store L=T+D symbols per channel. The variable number of symbols per frame necessitates a design which uses the available RAM efficiently and prevents overflow. Hence, no need for extra buffers. Also, it is desired to minimize the required RAM by storing only the channel symbols and not the sequence of channel identification bits.

Figure 19:
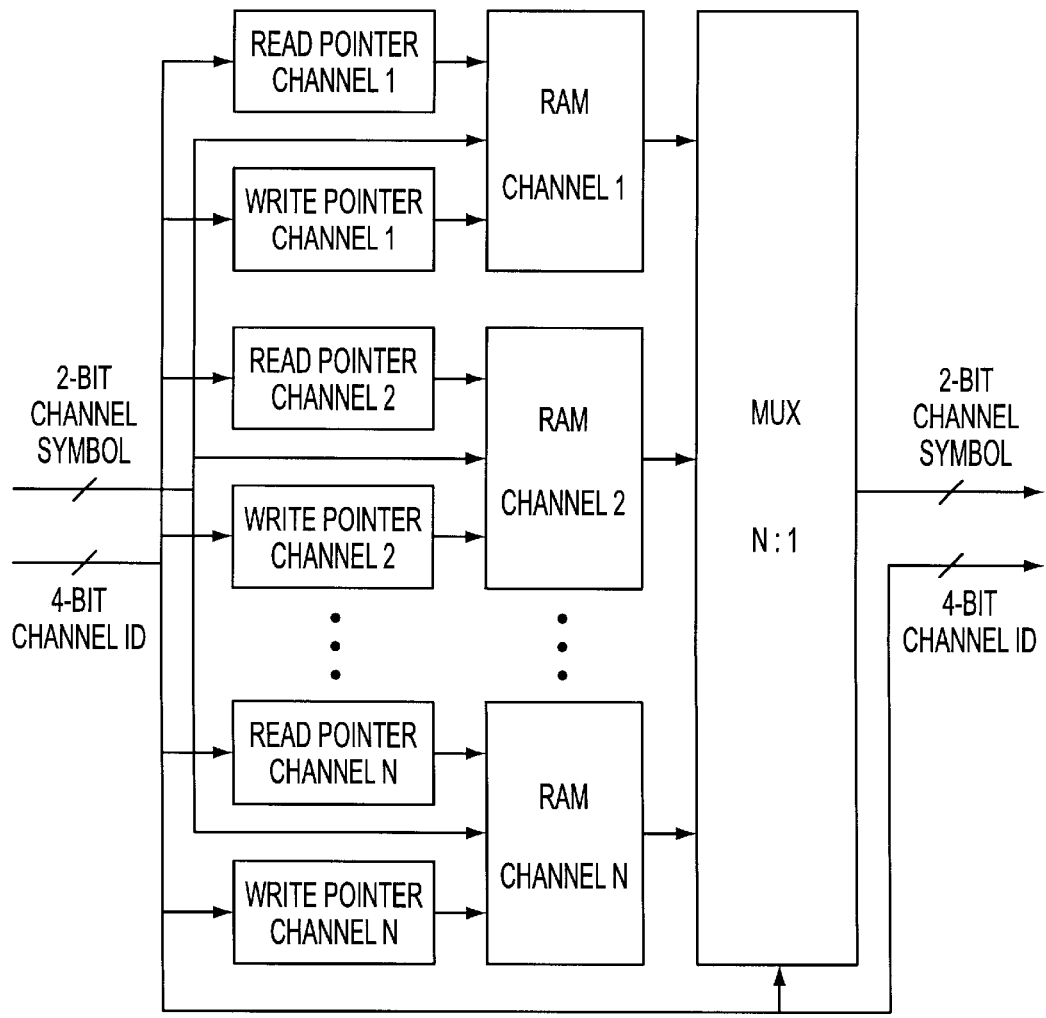
FIG. 19 illustrates a configuration for memory for storing branch metrics.

An efficient method for storing the b bit branch metric is shown in FIG. 19 which does not need to store channel identification numbers and does not need any type of flow control. The RAM for storing branch metrics is controlled by a group of N Read pointers and Write pointers. Upon receiving a channel symbol for the $i^{th}$ channel it is written in the RAM for channel i and in the next clocks $\eta$ oldest channel symbols, stored for this channel, are read out. That is, for each written channel symbol a block of $\eta$ channel symbols are read out. The ACS units process these symbols sequentially, $\eta$ times faster than the speed of an MLD. Therefore, no buffering and flow control is needed. The ID channel number for both written in and read out symbols is the same. Therefore, the channel ID for the symbol being written in can be also used for identifying the symbol being read out.

Figure 20:
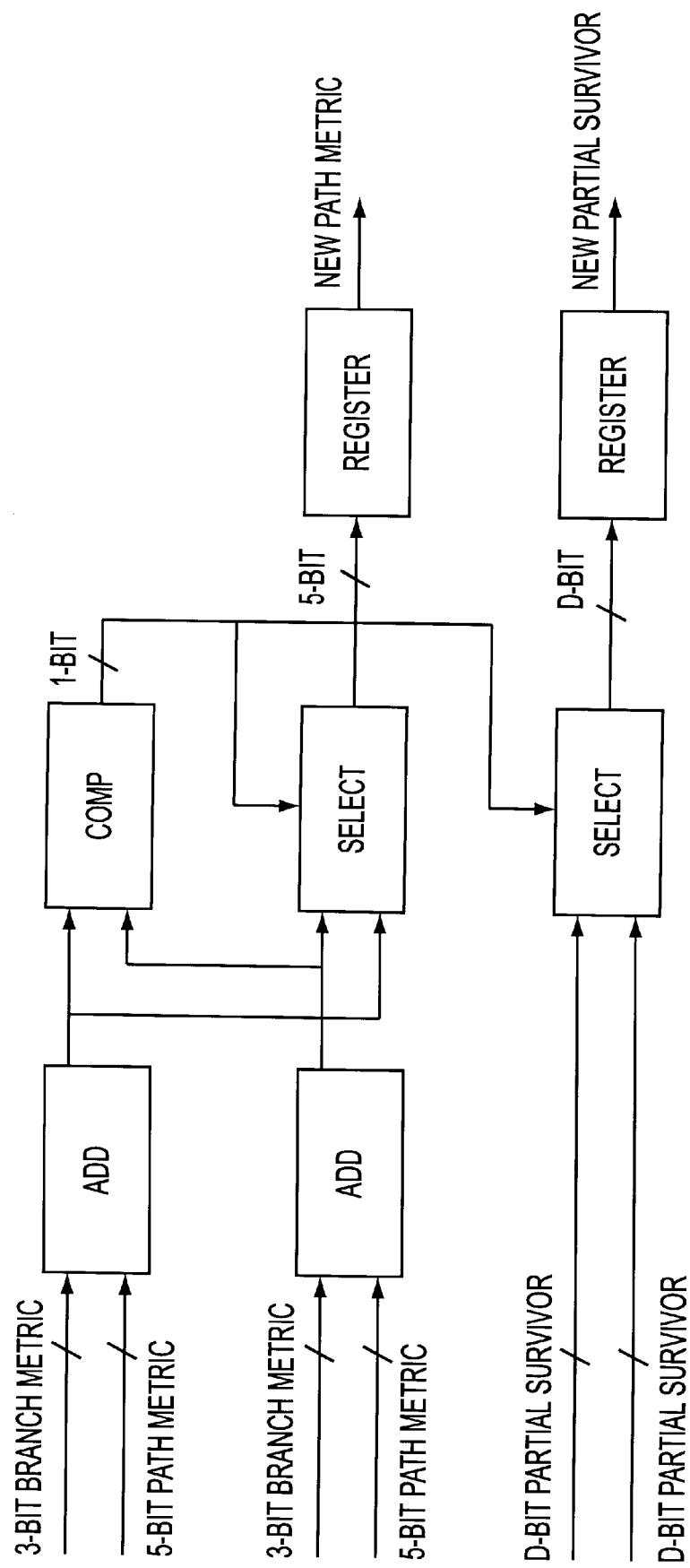
FIG. 20 illustrates a configuration of ACS units.

A configuration of ACS units and registers for storing new path metrics and partial survivors is shown in FIG. 20. A shared decoder employs 32 ACS units for full parallel processing of the received data. However, the path metrics and the partial survived paths can be routed to RAM in a bit serial fashion for reducing the chip space occupied by wires.

The number of bits required to represent branch metrics and path metrics are discussed in detail below. For VLSI design of a SCD even small reductions in the number of bits per metric is important because it reduces the complexity of computations and the amount of communications among decoder parts. For path metric calculation distance properties of the K=7 convolutional code of rate ½ and its punctured version of rate ¾ are analyzed.

For branch metric calculation, assume that the demodulator quantizer outputs are in the range from −X to +X and the encoder channel symbols are −1 and +1. The absolute value of branch metrics are added to the path metric if the channel symbol and the branch label agree otherwise the branch metric is subtracted from the path metric (if these two do not agree). Since differences of path metrics are important, when making decisions for survived paths, the absolute value of branch metrics can be added to all the corresponding path metrics, in this case, either the increments in the path metrics are zero or an even value. However, this is inefficient. Dividing by two results in eliminating double additions described above and cut the dynamic range of the accumulated metrics. Each I or Q component can be represented by only two bits and for the code of rate ½ each branch metric (sum of two components) can be represented by only b+1=3 bits.

For path metric calculation, the dynamic range of path metrics is upper bounded by n(q−1)(K−1) for a constraint length K code of rate 1/n, where q is the number of quantization levels. Hence the dynamic range is 2(8−1)(7−1)=84 or 7 bits for the K=7 code of rate ½ However, the upper bound on maximum dynamic range for path metrics reduces to 2(4−1)(7−1)=36 or 6 bits.

The above upper bound can be further improved by investigating distance structure of paths between a given trellis state and all the other states. This distance property was examined for the K=7 code of rate ½ and the results obtained show that maximum distance from the all zero state to any trellis state is 11. Hence maximum range of path metrics is (3)(11)=33 or about 5 bits. The distance of 11 occurs for only one path of 6 trellis steps. The next distance is 8 which is shorter than free distance of the code by two. Therefore, it seems reasonable to represent each path metric by p=5 bits.

For the punctured code of rate ¾, the maximum distance from the all zero state to any trellis state is 7 which occurs only for one state at seven trellis steps. The next distance is 6. Hence, maximum dynamic range of path metrics is (3)(7)=21 which comfortably can be represented by the 5 bits.

The decoding method of the present invention takes advantage of high processing speed of the ACS units to tradeoff the required on-chip memory with processing throughput and BER performance. Further, the decoding method of the present invention demonstrates excellent BER performance and requires minimal amount of RAM for the K=7 convolutional codes. This method is advantageous for decoding large constraint length, e.g., K>8, codes where management of traceback memory is of major concern.

While the present invention has been described in terms of a preferred embodiment, the scope of the invention is not limited thereto and is defined by the claims. For example, the decoding method of the present invention is not limited to application for onboard processing satellites and can be utilized in terrestrial or satellite earth stations receiving several low bit rate carriers.

What we claim is:

1. A method for decoding an encoded input signal comprising a plurality of channel symbols, wherein a Viterbi survivor exchange algorithm having S trellis/decoding states is used to continuously decode the input signal via a plurality of decoding cycles, each decoding cycle c comprising a total number T of individual trellis/decoding steps t, the method comprising the steps of:
   (a) setting the decoding cycle c=0;
   (b) processing the channel symbols for trellis/decoding steps t=cD+1 to (c+1)D using the Viterbi survivor exchange algorithm to compute and store branch metrics $B_t$, path metrics $\Gamma_t$ based on the branch metrics $B_t$ and previous path metrics $\Gamma_{t-1}$, and survivor paths $E_t$ based on the path metrics $\Gamma_t$ and previous survivor paths $E_{t-1}$, and to exchange the path metrics $\Gamma_t$ and the survivor paths $E_t$, wherein the survivor paths $E_t$ are stored in S registers each comprising D bits where D is a whole number less than T;
   (c) storing the path metrics $\Gamma_t$ as tentative path metrics $\Gamma_{(c+1)D}$ at the end of the trellis/decoding step t=(c+1)D;
   (d) processing the received channel symbols for trellis/decoding steps t=((c+1)D)+1 to cD+T using the Viterbi survivor exchange algorithm to compute and update the path metrics $\Gamma_t$ and to exchange, but not update, the survivor paths $E_t$ stored in the S registers;
   (e) selecting one of the survivor paths $E_t$ stored in the S registers as an estimate for D received information bits of the encoded input signal at the trellis/decoding step t=cD+T;
   (f) setting the decoding cycle c=c+1, the trellis decoding step t=cD+1, and the path metrics $\Gamma_t$ to be equal to the tentative path metrics $\Gamma_{(c+1)D}$; and
   (g) repeating steps (b) through (f) to continuously decode the encoded input signal.

2. The method according to claim 1, wherein step (e) further comprises selecting one of the survivor paths $E_t$ stored in the S registers having a corresponding maximum (or lowest) path metric as an estimate for D received information bits of the encoded input signal at the trellis/decoding step t=cD+T.

3. The method according to claim 1, wherein in step (e) an arbitrary one of the survivor paths $E_t$ stored in the S registers is selected as an estimate for D received information bits of the encoded input signal at the trellis/decoding step t=cD+T.

4. A method for decoding an encoded input signal comprising a plurality of channel symbols wherein a Viterbi survivor exchange algorithm having a number S of trellis/decoding states is used to continuously decode the input signal via a plurality of decoding cycles c each comprising a total number T of individual trellis/decoding steps t, the method comprising the steps of:
   (a) setting the decoding cycle c=0;
   (b) processing the channel symbols for trellis/decoding steps t=cD+1 to (c+1)D using the Viterbi survivor exchange algorithm to compute and store branch metrics $B_t$, a set of S path metrics $\Gamma_t=\{\gamma_{t,1}, \gamma_{t,2}, \ldots, \gamma_{t,S}\}$ based on the branch metrics $B_t$ and previous path metrics $\Gamma_{t-1}$, and survivor paths $E_t$ based on the path metrics $\Gamma_t$ and previous survivor paths $E_{t-1}$, wherein the survivor paths $E_t$ are stored in S registers each comprising D bits where D is a whole number less than T;
   (c) processing the received channel symbols for trellis/decoding steps t=((c+1)D)+1 to cD+T using the Viterbi survivor exchange algorithm to update the path metrics $\Gamma_t$ and exchange, but not update, the survivor paths $E_t$ stored in the S registers;
   (d) selecting and outputting one of the survivor paths $E_t$ stored in the S registers as an estimate for D received information bits of the encoded input signal at the trellis/decoding step t=cD+T by comparing the path metrics $\Gamma_t$;
   (e) setting the decoding cycle c=c+1, the trellis decoding step t=cD+1, and the path metrics $\Gamma_t=\{\gamma_{t,1}, \gamma_{t,2}, \ldots, \gamma_{t,S}\}$ as $\gamma_{t,i}=\alpha$ for $1 \leq i \leq S$, $i \neq k$, and $\gamma_{t,k}=\beta$ where $\alpha$ and $\beta$ are less than p bit integers which must be optimized and p is the number of bits for storing accumulated path metrics; and
   (f) repeating steps (b) through (e) to continuously decode the encoded input signal.

5. A method for decoding an encoded input signal comprising a plurality of channel symbols, wherein a Viterbi survivor exchange algorithm having a number S of trellis/decoding states is used to continuously decode the encoded input signal via a plurality of decoding cycles each comprising a total number T of individual trellis/decoding steps, the method comprising the steps of:
   (a) processing the channel symbols for D trellis/decoding steps using the Viterbi survivor exchange algorithm to compute a plurality of path metrics and a plurality of survivor paths, and storing and exchanging the survivor paths in S registers each comprising D bits, wherein D is a whole number less than T;
   (b) processing the received channel symbols for (T−D) trellis/decoding steps using the Viterbi survivor exchange algorithm to update the path metrics and to exchange, but not update, the survivor paths stored in the S registers;
   (c) selecting one of the survivor paths stored in the S registers as an estimate for D received information bits of the encoded input signal after T trellis/decoding steps by comparing the path metrics.

6. The method according to claim 5, wherein step (a) further comprises storing the path metrics as tentative path metrics after performing the D trellis/decoding steps.

7. The method according to claim 6 wherein the storing of path metrics is performed in RAM, using the same ID channel number for both written in and read out symbols, according to the following steps:
  defining pairs of n read pointers and n write pointers, and n corresponding locations in RAM, where n corresponds to a predetermined number of channels N;
  upon receiving a channel symbol for the $i^{th}$ channel, identified by said ID, writing said channel symbol in the RAM for channel I; and
  reading out in the next clocks η the oldest channel symbols stored for said $i^{th}$ channel, such that for each written channel symbol a block of η channel symbols are read out.

8. The method according to claim 7 further comprising processing said read out symbols sequentially in an ACS unit.

9. The method according to claim 5, wherein step (c) further comprises setting the path metrics to be equal to the tentative path metrics after T trellis/decoding steps and repeating steps (a) through (c) to continuously decode the encoded input signal.

10. A method for decoding an encoded input signal comprising a plurality of channel symbols, wherein a Viterbi survivor exchange algorithm having a number S of trellis/decoding states is used to continuously decode the input signal via a plurality of decoding cycles each comprising a total number T of individual trellis/decoding steps t, the method comprising the steps of:
  (a) processing the channel symbols for trellis/decoding steps t=1 to D using the Viterbi survivor exchange algorithm to compute branch metrics $B_t$, path metrics $Γ_t$, and survivor paths $E_t$, and storing and exchanging the survivor paths $E_t$ in S registers each comprising D bits, wherein D is a whole number less than T;
  (b) processing the received channel symbols for trellis/decoding steps t=D+1 to T using the Viterbi survivor exchange algorithm to update the path metrics $Γ_t$ and to exchange, but not update, the survivor paths $E_t$ stored in the S registers;
  (c) selecting one of the survivor paths $E_t$ stored in the S registers as an estimate for D received information bits of the encoded input signal at the trellis/decoding step t=T.

11. A method for decoding an encoded input signal comprising a plurality of channel symbols, wherein a Viterbi survivor exchange algorithm having a number S of trellis/decoding states is used to continuously decode the input signal via a plurality of decoding cycles each comprising a total number T of individual trellis/decoding steps t, the method comprising the steps of:
  (a) processing the channel symbols for trellis/decoding steps t=1 to D using the Viterbi survivor exchange algorithm to compute branch metrics $B_t$, path metrics $Γ_t$, and survivor paths $E_t$, and storing and exchanging the survivor paths $E_t$ in S registers each comprising D bits, wherein D is a whole number less than T;
  (b) processing the received channel symbols for trellis/decoding steps t=D+1 to T using the Viterbi survivor exchange algorithm to update the path metrics $Γ_t$ and to exchange, but not update, the survivor paths $E_t$ stored in the S registers;
  (c) selecting one of the survivor paths $E_t$ stored in the S registers as an estimate for D received information bits of the encoded input signal at the trellis/decoding step t=T.

12. A shared multi-channel Viterbi decoder operative to decode an encoded input signal having I and Q samples comprising a plurality of channel symbols, said decoder comprising:
  a branch metric calculator operative to receive said I and Q samples and calculate branch metrics $B_t$;
  a branch metric queue for storing branch metrics calculated by said branch metric calculator;
  a plurality of ACS units, each being responsive to the branch metrics in said branch metric queue and operative to compute new path metrics and survivor paths;
  a first memory responsive to said ACS units for storing said new path metrics and survivor paths;
  a second memory for storing previous path metrics and previous survivor paths;
  a tentative path metric memory for storing tentative path metrics; and
  a multiplexer for selecting the previous path metrics when t≠T+cD, and selecting the tentative path metrics when t=T+cD.

13. The decoder as set forth in claim 12 wherein said tentative path metric memory stores a set of tentative path metrics and a sequence of branch metrics for the most recently received I and Q components of the received channel symbols.

14. The decoder as set forth in claim 13, wherein decoder comprises a Viterbi survivor exchange algorithm having a number S of trellis/decoding states is used to continuously decode the encoded input signal via a plurality of decoding cycles each comprising a total number T of individual trellis/decoding steps, the algorithm comprising the steps of:
  (a) processing the channel symbols for D trellis/decoding steps using the Viterbi survivor exchange algorithm to compute a plurality of path metrics and a plurality of survivor paths, and storing and exchanging the survivor paths in S registers each comprising D bits, wherein D is a whole number less than T;
  (b) processing the received channel symbols for (T−D) trellis/decoding steps using the Viterbi survivor exchange algorithm to update the path metrics and to exchange, but not update, the survivor paths stored in the S registers;
  (c) selecting one of the survivor paths stored in the S registers as an estimate for D received information bits of the encoded input signal after T trellis/decoding steps by comparing the path metrics.

15. The decoder according to claim 14, wherein step (a) further comprises storing the path metrics as tentative path metrics after performing the D trellis/decoding steps.

16. The decoder according to claim 14, wherein step (c) further comprises setting the path metrics to be equal to the tentative path metrics after T trellis/decoding steps and repeating steps (a) through (c) to continuously decode the encoded input signal.

17. A shared multi-channel Viterbi decoder operative to decode an encoded input signal having I and Q samples comprising a plurality of channel symbols, said decoder comprising:
  a branch metric calculator operative to receive said I and Q samples and calculate branch metrics $B_t$;
  a branch metric queue for storing branch metrics calculated by said branch metric calculator;
  a plurality of ACS units, each being responsive to the branch metrics in said branch metric queue and operative to compute new path metrics and survivor paths;

a first memory responsive to said ACS units for storing said new path metrics and survivor paths;

a second memory for storing previous path metrics and previous survivor paths;

means for selecting a state having the best path metrics and outputting the contents of the survivor register as the D decoded bits; and a multiplexer for selecting the previous path metrics when $t \neq T+cD$, and selecting the best path and setting the corresponding path metrics when $t=T+cD$.

18. The decoder as set forth in claim 17, wherein decoder comprises a Viterbi survivor exchange algorithm having S trellis/decoding states and being used to continuously decode the input signal via a plurality of decoding cycles, each decoding cycle c comprising a total number T of individual trellis/decoding steps t, said algorithm comprising the steps of:

(a) setting the decoding cycle c=0;

(b) processing the channel symbols for trellis/decoding steps $t=cD+1$ to $(c+1)D$ using the Viterbi survivor exchange algorithm to compute and store branch metrics $B_t$, a set of S path metrics $\Gamma_t=\{\gamma_{t,1}, \gamma_{t,2}, \ldots, \gamma_{t,S}\}$ based on the branch metrics $B_t$ and previous path metrics $\Gamma_{t-1}$, and survivor paths $E_t$ based on the path metrics $\Gamma_t$ and previous survivor paths $E_{t-1}$, wherein the survivor paths $E_t$ are stored in S registers each comprising D bits where D is a whole number less than T;

(c) processing the received channel symbols for trellis/decoding steps $t=((c+1)D)+1$ to $cD+T$ using the Viterbi survivor exchange algorithm to update the path metrics $\Gamma_t$ and exchange, but not update, the survivor paths $E_t$ stored in the S registers;

(d) selecting and outputting one of the survivor paths $E_t$ stored in the S registers as an estimate for D received information bits of the encoded input signal at the trellis/decoding step $t=cD+T$ by comparing the path metrics $\Gamma_t$;

(e) setting the decoding cycle c=c+1, the trellis decoding step $t=cD+1$, and the path metrics $\Gamma_t=\{\gamma_{t,1}, \gamma_{t,2}, \ldots, \gamma_{t,S}\}$ as $\gamma_{t,i}=\alpha$ for $1 \leq i \leq S$, $i \neq k$, and $\gamma_{t,k}=\beta$ where $\alpha$ and $\beta$ are less than p bit integers which must be optimized and p is the number of bits for storing accumulated path metrics; and (f) repeating steps (b) through (e) to continuously decode the encoded input signal.

19. A computer program product comprising a computer program for implementing a method for decoding an encoded input signal comprising a plurality of channel symbols, wherein a Viterbi survivor exchange algorithm having S trellis/decoding states is used to continuously decode the input signal via a plurality of decoding cycles, each decoding cycle c comprising a total number T of individual trellis/decoding steps t, the method comprising the steps of:

(a) setting the decoding cycle c=0;

(b) processing the channel symbols for trellis/decoding steps $t=cD+1$ to $(c+1)D$ using the Viterbi survivor exchange algorithm to compute and store branch metrics $B_t$, path metrics $\Gamma_t$ based on the branch metrics $B_t$ and previous path metrics $\Gamma_{t-1}$, and survivor paths $E_t$ based on the path metrics $\Gamma_t$ and previous survivor paths $E_{t-1}$, and to exchange the path metrics $\Gamma_t$ and the survivor paths $E_t$, wherein the survivor paths $E_t$ are stored in S registers each comprising D bits where D is a whole number less than T;

(c) storing the path metrics $\Gamma_t$ as tentative path metrics $\Gamma_{(c+1)D}$ at the end of the trellis/decoding step $t=(c+1)D$;

(d) processing the received channel symbols for trellis/decoding steps $t=((c+1)D)+1$ to $cD+T$ using the Viterbi survivor exchange algorithm to compute and update the path metrics $\Gamma_t$ and to exchange, but not update, the survivor paths $E_t$ stored in the S registers;

(e) selecting one of the survivor paths $E_t$ stored in the S registers as an estimate for D received information bits of the encoded input signal at the trellis/decoding step $t=cD+T$;

(f) setting the decoding cycle c=c+1, the trellis decoding step $t=cD+1$, and the path metrics $\Gamma_t$ to be equal to the tentative path metrics $\Gamma_{(c+1)D}$; and (g) repeating steps (b) through (f) to continuously decode the encoded input signal.

20. The computer program product according to claim 19, wherein step (e) further comprises selecting one of the survivor paths $E_t$ stored in the S registers having a corresponding maximum (or lowest) path metric as an estimate for D received information bits of the encoded input signal at the trellis/decoding step $t=cD+T$.

21. The computer program product according to claim 19, wherein in step (e) an arbitrary one of the survivor paths $E_t$ stored in the S registers is selected as an estimate for D received information bits of the encoded input signal at the trellis/decoding step $t=cD+T$.

22. A computer program product comprising a computer program for implementing a method for decoding an encoded input signal comprising a plurality of channel symbols wherein a Viterbi survivor exchange algorithm having a number S of trellis/decoding states is used to continuously decode the input signal via a plurality of decoding cycles c each comprising a total number T of individual trellis/decoding steps t, the method comprising the steps of:

(a) setting the decoding cycle c=0;

(b) processing the channel symbols for trellis/decoding steps $t=cD+1$ to $(c+1)D$ using the Viterbi survivor exchange algorithm to compute and store branch metrics $B_t$, a set of S path metrics $\Gamma_t=\{\gamma_{t,1}, \gamma_{t,2}, \ldots, \gamma_{t,S}\}$ based on the branch metrics $B_t$ and previous path metrics $\Gamma_{t-1}$, and survivor paths $E_t$ based on the path metrics $\Gamma_t$ and previous survivor paths $E_{t-1}$, wherein the survivor paths $E_t$ are stored in S registers each comprising D bits where D is a whole number less than T;

(c) processing the received channel symbols for trellis/decoding steps $t=((c+1)D)+1$ to $cD+T$ using the Viterbi survivor exchange algorithm to update the path metrics $\Gamma_t$ and exchange, but not update, the survivor paths $E_t$ stored in the S registers;

(d) selecting and outputting one of the survivor paths $E_t$ stored in the S registers as an estimate for D received information bits of the encoded input signal at the trellis/decoding step $t=cD+T$ by comparing the path metrics $\Gamma_t$;

(e) setting the decoding cycle c=c+1, the trellis decoding step $t=cD+1$, and the path metrics $\Gamma_t=\{\gamma_{t,1}, \gamma_{t,2}, \ldots, \gamma_{t,S}\}$ as $\gamma_{t,i}=\alpha$ for $1 \leq i \leq S$, $i \neq k$, and $\gamma_{t,k}=\beta$ where $\alpha$ and $\beta$ are less than p bit integers which must be optimized and p is the number of bits for storing accumulated path metrics; and (f) repeating steps (b) through (e) to continuously decode the encoded input signal.

23. A computer program product comprising a computer program for implementing a method for decoding an encoded input signal comprising a plurality of channel symbols, wherein a Viterbi survivor exchange algorithm having a number S of trellis/decoding states is used to continuously decode the encoded input signal via a plurality of decoding cycles each comprising a total number T of individual trellis/decoding steps, the method comprising the steps of:

(a) processing the channel symbols for D trellis/decoding steps using the Viterbi survivor exchange algorithm to compute a plurality of path metrics and a plurality of survivor paths, and storing and exchanging the survivor paths in S registers each comprising D bits, wherein D is a whole number less than T;

(b) processing the received channel symbols for (T−D) trellis/decoding steps using the Viterbi survivor exchange algorithm to update the path metrics and to exchange, but not update, the survivor paths stored in the S registers;

(c) selecting one of the survivor paths stored in the S registers as an estimate for D received information bits of the encoded input signal after T trellis/decoding steps by comparing the path metrics.

24. The computer program product according to claim 23, wherein step (a) further comprises storing the path metrics as tentative path metrics after performing the D trellis/decoding steps.

25. The computer program product according to claim 24, wherein step (c) further comprises setting the path metrics to be equal to the tentative path metrics after T trellis/decoding steps and repeating steps (a) through (c) to continuously decode the encoded input signal.

26. A computer program product comprising a computer program for implementing a method for decoding an encoded input signal comprising a plurality of channel symbols, wherein a Viterbi survivor exchange algorithm having a number S of trellis/decoding states is used to continuously decode the input signal via a plurality of decoding cycles each comprising a total number T of individual trellis/decoding steps t, the method comprising the steps of:

(a) processing the channel symbols for trellis/decoding steps $t=1$ to D using the Viterbi survivor exchange algorithm to compute branch metrics $B_t$, path metrics $\Gamma_t$, and survivor paths $E_t$, and storing and exchanging the survivor paths $E_t$ in S registers each comprising D bits, wherein D is a whole number less than T;

(b) processing the received channel symbols for trellis/decoding steps $t=D+1$ to T using the Viterbi survivor exchange algorithm to update the path metrics $\Gamma_t$ and to exchange, but not update, the survivor paths $E_t$ stored in the S registers;

(c) selecting one of the survivor paths $E_t$ stored in the S registers as an estimate for D received information bits of the encoded input signal at the trellis/decoding step $t=T$.

* * * * *